US009728341B2

(12) United States Patent
Naito et al.

(10) Patent No.: US 9,728,341 B2
(45) Date of Patent: Aug. 8, 2017

(54) ELECTRONIC COMPONENT, METHOD FOR PRODUCING SAME, AND SEALING MATERIAL PASTE USED IN SAME

(71) Applicant: Hitachi Chemical Company, Ltd., Chiyoda-ku, Tokyo (JP)

(72) Inventors: Takashi Naito, Tokyo (JP); Shinichi Tachizono, Tokyo (JP); Kei Yoshimura, Tokyo (JP); Yuji Hashiba, Tokyo (JP); Motomune Kodama, Tokyo (JP); Masanori Miyagi, Tokyo (JP); Takuya Aoyagi, Tokyo (JP); Yuichi Sawai, Tokyo (JP); Tadashi Fujieda, Tokyo (JP); Takeshi Tsukamoto, Tokyo (JP); Hajime Murakami, Tokyo (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 191 days.

(21) Appl. No.: 14/415,229

(22) PCT Filed: Jul. 25, 2013

(86) PCT No.: PCT/JP2013/070177
§ 371 (c)(1),
(2) Date: Jan. 16, 2015

(87) PCT Pub. No.: WO2014/021187
PCT Pub. Date: Feb. 6, 2014

(65) Prior Publication Data
US 2015/0187510 A1    Jul. 2, 2015

(30) Foreign Application Priority Data

Jul. 30, 2012    (JP) ................................ 2012-167905

(51) Int. Cl.
| | | |
|---|---|---|
| *C03C 8/24* | (2006.01) | |
| *C03C 8/08* | (2006.01) | |
| *H01G 9/20* | (2006.01) | |
| *H01M 14/00* | (2006.01) | |
| *H01L 51/52* | (2006.01) | |
| *H01L 23/29* | (2006.01) | |

(Continued)

(52) U.S. Cl.
CPC ................ *H01G 9/20* (2013.01); *B32B 3/06* (2013.01); *B32B 7/14* (2013.01); *B32B 17/06* (2013.01); *B32B 17/10018* (2013.01); *B32B 17/10119* (2013.01); *B32B 17/10788* (2013.01); *B32B 37/12* (2013.01); *B32B 37/18* (2013.01); *B32B 38/0008* (2013.01); *B32B 38/0036* (2013.01); *B32B 38/164* (2013.01); *C08K 3/22* (2013.01); *H01L 23/295* (2013.01); *H01L 51/0096* (2013.01); *H01L 51/5246* (2013.01); *H01M 14/00* (2013.01); *B32B 2038/168* (2013.01); *B32B 2250/03* (2013.01); *B32B 2255/20* (2013.01); *B32B 2255/26* (2013.01); *B32B 2307/412* (2013.01); *B32B 2457/12* (2013.01); *B32B 2457/206* (2013.01); *C08K 2003/2258* (2013.01); *C08K 2003/2265* (2013.01); *H01G 9/2077* (2013.01); *H01L 51/448* (2013.01); *H01L 2924/0002* (2013.01); *H05B 33/04* (2013.01); *Y10T 428/239* (2015.01)

(58) Field of Classification Search
CPC .................................. C03C 8/024; C03C 8/08
See application file for complete search history.

(56) References Cited

U.S. PATENT DOCUMENTS

| | | | |
|---|---|---|---|
| 5,066,621 A | 11/1991 | Akhtar | |
| 8,470,723 B2 * | 6/2013 | Naito | ........................ C03C 3/21 252/500 |

(Continued)

FOREIGN PATENT DOCUMENTS

| | | |
|---|---|---|
| CN | 101265024 A | 9/2008 |
| CN | 101633560 A | 1/2010 |

(Continued)

OTHER PUBLICATIONS

Chinese-language Office Action issued in counterpart Chinese Application No. 201380041196.2 dated Oct. 17, 2016 with English translation (37 pages).
International Search Report dated Oct. 15, 2013 with English translation (three (3) pages).
Naito et al., "Lead-Free Low-Melting and Semiconductive Vanadate Glass Applicable to Low-Temperature Sealing," Japanese Journal of Applied Physics, 2011, vol. 5 (two (2) pages).

(Continued)

*Primary Examiner* — Karl Group
(74) *Attorney, Agent, or Firm* — Crowell & Moring LLP

(57) ABSTRACT

An electronic component has an organic member between two transparent substrates, in which outer peripheral portions of the two transparent substrates are bonded by a sealing material containing to melting glass. The low melting glass contains vanadium oxide, tellurium oxide, iron oxide and phosphoric acid, and satisfies the following relations (1) and (2) in terms of oxides. The sealing material is formed of a sealing material paste which contains the low melting glass, a resin binder and a solvent, the low melting glass containing vanadium oxide, tellurium oxide, iron oxide and phosphoric acid, and satisfies the following relations (1) and (2) in terms of the oxides. Thereby, thermal damages to an organic element or an organic material contained in the electronic component can be reduced and an electronic component having a glass bonding layer of high reliability can be produced efficiently.

$V_2O_5 + TeO_2 + Fe_2O + P_2O_5 \geq 90$(mass %)    (1)

$V_2O_5 > TeO_2 > Fe_2O_3 > P_2O_5$ (mass %)    (2)

6 Claims, 10 Drawing Sheets

(51) Int. Cl.
*B32B 3/06* (2006.01)
*B32B 7/14* (2006.01)
*B32B 17/06* (2006.01)
*B32B 37/12* (2006.01)
*B32B 37/18* (2006.01)
*B32B 38/00* (2006.01)
*C08K 3/22* (2006.01)
*H01L 51/00* (2006.01)
*B32B 17/10* (2006.01)
*H05B 33/04* (2006.01)
*B32B 38/16* (2006.01)
*H01L 51/44* (2006.01)

(56) References Cited

U.S. PATENT DOCUMENTS 8,685,872 B2 * 4/2014 Naito ................... C03C 3/21
501/14
2004/0207314 A1 10/2004 Aitken et al.
2009/0069164 A1 3/2009 Lamberson et al.
2010/0180934 A1 * 7/2010 Naito ................... C03C 3/21
136/252
2013/0333748 A1 * 12/2013 Naito ................... C03C 3/21
136/252

FOREIGN PATENT DOCUMENTS

| CN | 101781090 A | 7/2010 |
| JP | 2008-527656 A | 7/2008 |
| JP | 2010-52990 A | 3/2010 |
| JP | 2010-184852 A | 8/2010 |
| JP | 4540669 B2 | 9/2010 |
| JP | 2012-14971 A | 1/2012 |
| WO | WO 2007/067402 A2 | 6/2007 |

OTHER PUBLICATIONS

Naito et al., "Influence of $P_2O_5/TeO_2$ composition ratio on the physical properties of $V_2O_5$-$P_2O_5$-$TeO_2$ glasses for lead-free low-temperature sealing," Journal of the Ceramic Society of Japan, Feb. 12, 2013, pp. 452-456, vol. 121, No. 5.

* cited by examiner

ELECTRONIC COMPONENT, METHOD FOR PRODUCING SAME, AND SEALING MATERIAL PASTE USED IN SAME

TECHNICAL FIELD

The present invention relates to an electronic component in which an organic element or an organic material is disposed between two transparent substrates and outer peripheral portions thereof are bonded by using a sealing material containing a low melting glass.

BACKGROUND ART

In an electronic component in which an organic element or an organic material is disposed between two transparent substrates, countermeasures, for example, bonding the outer peripheral portions of the two transparent substrates with a resin sealing material and further disposing a drying agent to the inside of the electronic component, etc. have been adopted in order to protect the organic element or the organic material against moisture, water, etc. However, the resin bonding was poor at a gas barrier property (airtightness), and molecules of water were likely to permeate gradually and then the resin bonding failed to obtain a sufficient reliability. On the other hand, while a sealing material using low melting glass can provide bonding of high gas barrier property (airtightness) but the bonding temperature is remarkably higher than that of the resin sealing material and exceeds temperature for the heat resistance of the organic element or the organic material disposed in the electronic component.

Then, a laser sealing capable of local heating was devised. As the sealing material, low melting glass capable of airtight bonding is used. It is important that the low melting glass is heated and softened and fluidized by absorption of a laser light used. By using such a method, since only the outer peripheral portions of the two transparent substrates can be heated, glass bonding of high gas barrier property (airtightness) is possible without thermally damaging the organic element or the organic material disposed in the electronic component.

In devices such as a display which contains an organic light emitting diode (OLED), a glass substrate in which a sealing material is temporarily sintered to the outer peripheral portion and the other glass substrate formed with the OLED are brought into contact and a laser is applied through the glass substrate thereby softening and fluidizing the low melting glass in the sealing material to bond the two glass substrates. A sealing material is proposed in Patent Literature 1 which can be used for bonding an outer peripheral portion of an OLED display by a laser. The sealing material contains a $V_2O_5$—$P_2O_5$—$Sb_2O_3$ type low melting glass that can be heated by the laser and filler particles of lithium aluminosilicate (β-eucryptite) for lowering a heat expansion coefficient. Further, the low melting glass contains one of $K_2O$, $Fe_2O_3$, $ZnO$, $TiO_2$, $Al_2O_3$, $B_2O_3$ and $WO_3$ and has a transition point. $T_g$ lower than 350° C. A glass package using a sealing material identical with that of Patent Literature 1 is also proposed in Patent Literature 2. The low melting glass contained in the sealing material is also identical with that of Patent Literature 1. Herein, trivalent or tetravalent vanadium ions are prevented from changing to penta-valence by temporarily sintering to the outer peripheral portion of the glass substrate in a less oxidizing atmosphere with a smaller amount of oxygen than that in air. And this process thereby prevents the softening and fluidizing property by laser irradiation from degradation and prevents the moisture resistance and water resistance at the bonded portion from deterioration after the laser sealing.

PRIOR ART DOCUMENTS

Patent Literature

Patent Literature 1: Japanese Patent No. 4540669
Patent Literature 2: Re-publication of PCT International Publication No. 2008-527656

SUMMARY OF INVENTION

Technical Problem

It was necessary to apply temporary sintering as a lower temperature for a long time since the $V_2O_5$—$P_2O_5$—$Sb_2O_3$ type low melting glass contained in the sealing material described above tends so be devitrified (crystallized) and the softening and fluidizing property by laser irradiation and the bondability are deteriorated when it is devitrified. While the softening and fluidizing property and the bondability can be improved by increasing a laser power, this may possibly cause thermal damages to the organic element and the organic material disposed in the electronic component. Further, it was necessary to perform temporary sintering before laser sealing in a low oxygen atmosphere in order to ensure the moisture resistance and the water resistance after laser bonding.

Then, the present invention intends no efficiently produce an electronic component capable of decreasing thermal damages to an organic element or an organic material disposed in the electronic component and to efficiently produce the electronic component having a glass bonding layer of high reliability.

Solution to Problem

In order to solve the subject, the present invention provides an electronic component which has an organic member between two transparent substrates, outer peripheral portions of the two transparent substrates being bonded with a sealing material containing a low melting glass, in which the low melting glass contains vanadium oxide, tellurium oxide, iron oxide and phosphorous oxide and satisfies the following relations (1) and (2) in terms of oxides.

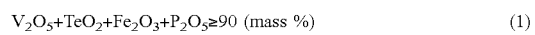

$$V_2O_5 + TeO_2 + Fe_2O_3 + P_2O_5 \geq 90 \text{ (mass \%)} \quad (1)$$

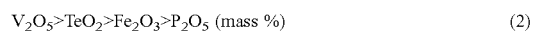

$$V_2O_5 > TeO_2 > Fe_2O_3 > P_2O_5 \text{ (mass \%)} \quad (2)$$

Further, the present invention provides a sealing material paste containing a low melting glass, a resin binder and a solvent, in which the low melting glass contains vanadium oxide, tellurium oxide, iron oxide and phosphorous oxide, and satisfies the following relations (1) and (2) in terms of oxides.

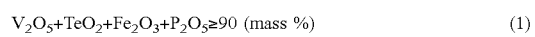

$$V_2O_5 + TeO_2 + Fe_2O_3 + P_2O_5 \geq 90 \text{ (mass \%)} \quad (1)$$

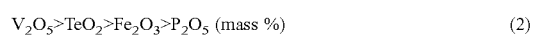

$$V_2O_5 > TeO_2 > Fe_2O_3 > P_2O_5 \text{ (mass \%)} \quad (2)$$

Advantageous Effects of Invention

The present invention can efficiently produce an electronic, component capable of reducing thermal damages to an organic element or an organic material disposed in the electronic component and having a glass bonding layer of high reliability.

DESCRIPTION OF EMBODIMENTS

The present invention is described as below.

Figure 1:
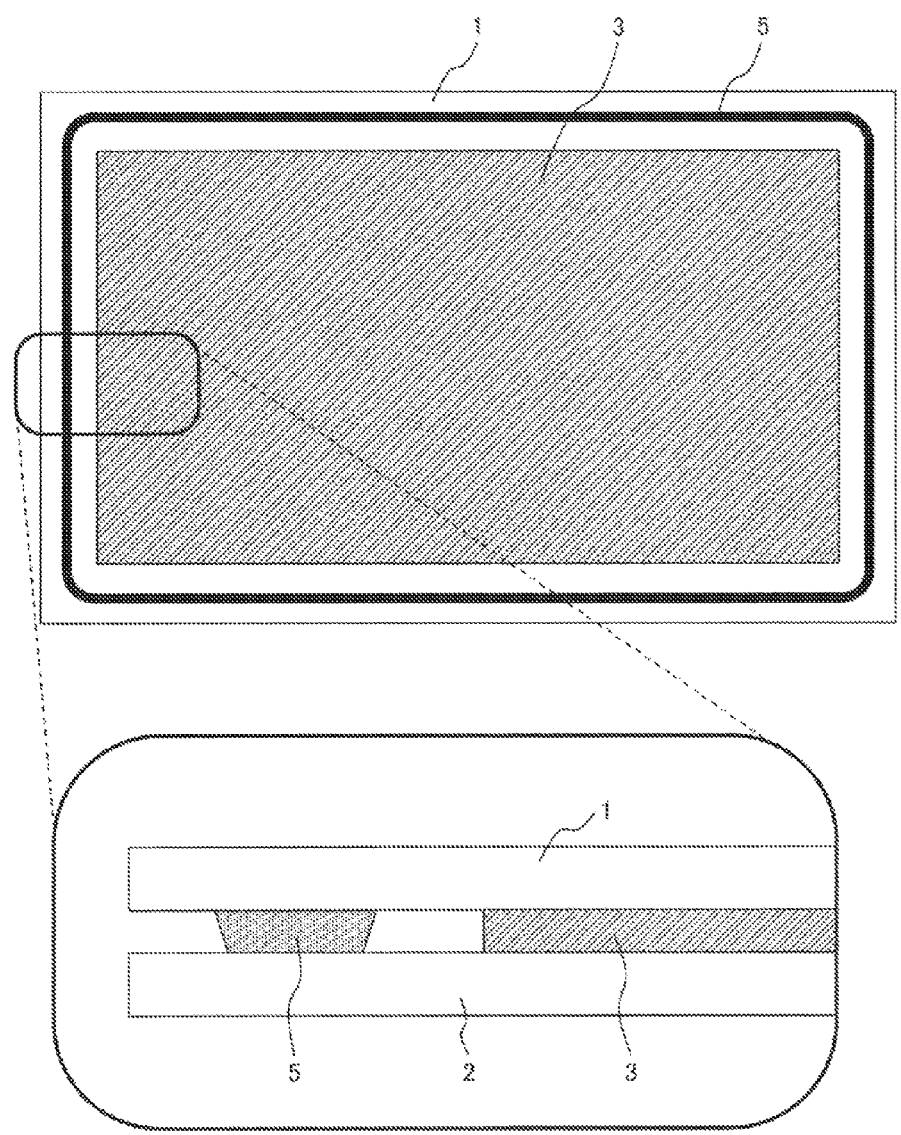
FIG. 1 is an example of a schematic top view of an electronic component and a schematic cross sectional view of a sealed portion thereof.
Figure 2:
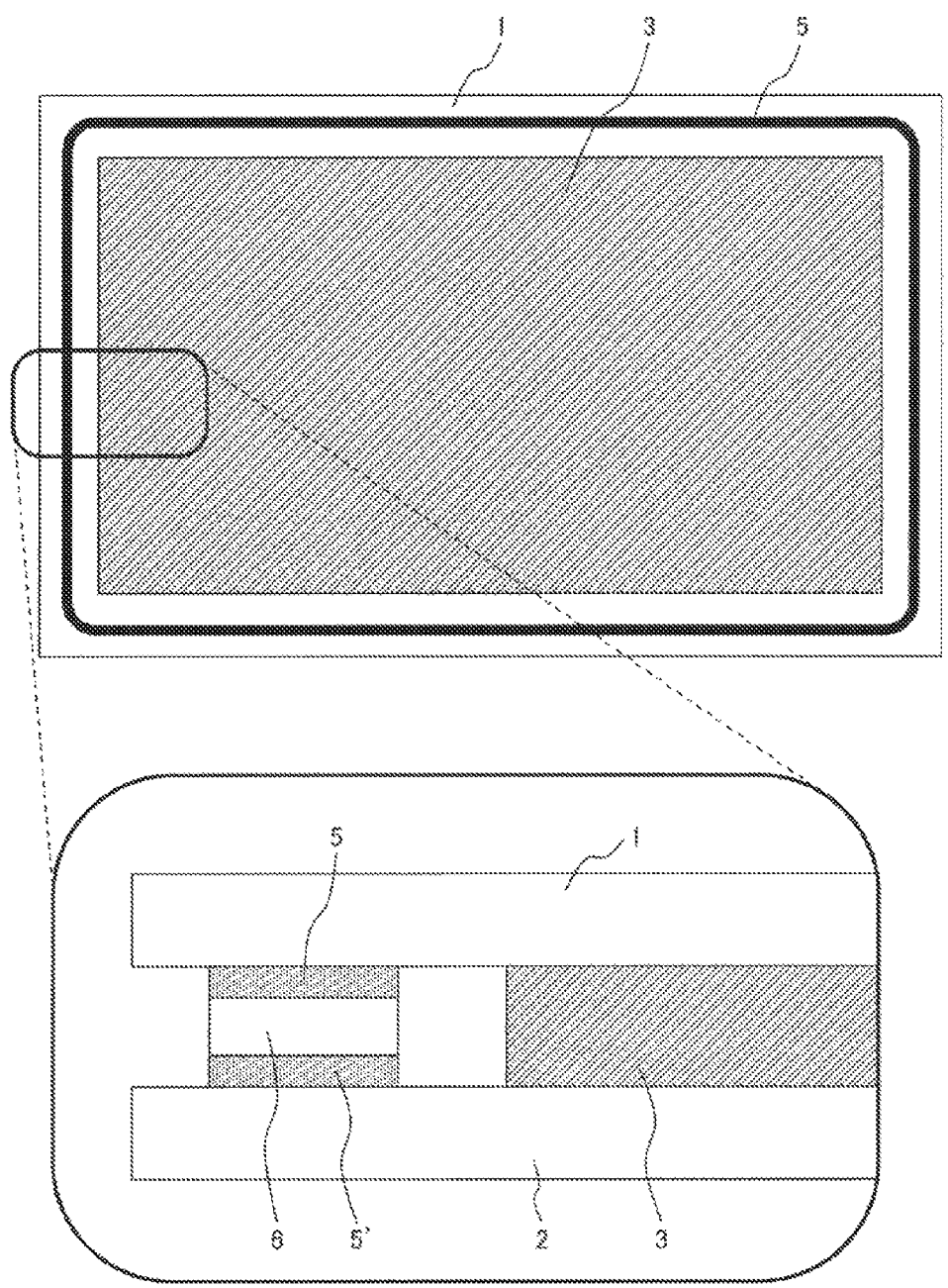
FIG. 2 is an example of a schematic top view of an electronic component and a schematic cross sectional view of a sealed portion thereof.

FIG. 1 and FIG. 2 illustrate a schematic top view and a schematic cross sectional view for two types of electronic components and a sealed portion thereof in an embodiment of the present invention.

In the electronic component shown in FIG. 1, one or more organic members 3 (organic element or organic material) is provided between two transparent substrates 1 and 2. Outer peripheral portions of the two transparent substrates 1 and 2 are bonded by a sealing material 5 containing low melting glass.

FIG. 2 illustrates a case in which the distance between the two transparent substrates 1 and 2 is large. In the drawing, outer peripheral portions of two transparent substrates 1 and 2 are bonded by sealing materials 5 and 5' with a spacer 6.

The present invention has a feature that the low melting glass contained in the sealing materials 5, 5' contains vanadium oxide, tellurium oxide, iron oxide and phosphorous oxide and satisfies the following relations (1) and (2) in terms of oxides:

$$V_2O_5+TeO_2+Fe_2O_3+P_2O_5 \geq 90 \text{ (mass \%)} \quad (1)$$

$$V_2O_5>TeO_2>Fe_2O_3>P_2O_5 \text{ (mass \%)} \quad (2)$$

In this specification, the chemical formulas used in numerical formulas represent compositions (numerical values) of the oxides on the mass basis.

The low melting glass satisfying the conditions efficiently absorbs a wavelength of a laser upon laser irradiation and is heated and easily softened and fluidized. That is, heating can be restricted only to desired portions by using the low melting glass and the laser, and the outer peripheral portions of the two transparent substrates 1 and 2 can be bonded at high reliability without giving thermal damages to the organic member 3.

The effective wavelength of the laser used is in a range from 400 to 1100 nm which is absorbed efficiently in the low melting glass and transmits the transparent substrate. When the wavelength is 400 nm or more, the transparent substrate and the organic element or the organic material inside thereof can be prevented from degradation by heating. On the other hand, when the wavelength is at 1100 on or less, the laser tends to be absorbed in the low melting glass, and to show a good softening and fluidizing property. Further, even when a water-containing portion is present, undesired effect on the glass by heating can be prevented.

It is important that the low melting glass contains $V_2O_5$ by the greatest amount in terms of oxides, by which the glass absorbs a wavelength in a range from 400 to 1100 nm and is heated. Also the transition point $T_g$ and the softening point $T_s$ of the low melting glass can be lowered and the glass can be softened and fluidized by laser irradiation at a wavelength in a range from 400 to 1100 nm.

$TeO_2$ and $P_2O_5$ are important ingredients for vitrification. If the material is not glass, it cannot be softened and fluidized at a low temperature. Further, it cannot be readily softened and fluidized also by the laser irradiation. $P_2O_5$ has a larger vitrifying effect than $TeO_2$ and is effective for decreasing thermal expansion. However, if the content is more than that of $TeO_2$, the moisture resistance and water resistance are deteriorated to increase the transition point $T_g$ and the softening point $T_s$. On the other hand, as the $TeO_2$ content is increased, while the transition point $T_g$ and the softening point $T_s$ can be lowered, the heat expansion coefficient tends to be larger. If it is excessively large, the low melting glass may sometimes be fractured before softening and fluidization due to thermal shock by the laser irradiation.

$Fe_2O_3$ is an ingredient that absorbs the laser at the wavelength in the range from 400 to 1100 nm like $V_2O_5$. When it is contained by an appropriate amount together with $V_2O_5$, the laser sealed portion of high airtightness and sealability can be obtained even after atmospheric sintering. Further, since $Fe_2O_3$ is an ingredient that acts on $P_2O_5$ to improve the moisture resistance and the water resistance of the low melting glass and decrease the thermal expansion, it is necessary that an appropriate amount of $Fe_2O_3$ is larger than the content of $P_2O_5$. Further, when the amount is decreased to less than the content of $TeO_2$, the softening and the fluidizing property of the low melting glass can be kept and crystallization thereof by heating can be prevented.

Respective roles of $V_2O_5$, $TeO_2$, $Fe_2O_3$ and $P_2O_5$ and advantageous effects thereof described above are developed effectively when the total content of them is 90 mass % or more. If this is less than 90 mass %, the bonded portion of the high reliability (bondability, adhesivity, moisture resistance, water resistance, etc.) by the laser irradiation cannot be obtained.

Further, one or more of tungsten oxide, molybdenum oxide, manganese oxide, zinc oxide, barium oxide, strontium oxide, and calcium oxide is preferably contained as the ingredient of the low melting glass and it is desired to satisfy the following relation (3) in terms of oxides.

$$WO_3+MoO_3+MnO_2+ZnO+BaO+SrO+F+CaO \leq 10 \text{ mass \%} \quad (3)$$

When the total content of them is 10 mass % or less, it is possible to lower the transition point $T_g$ and the softening point $T_s$, to decrease the heat expansion coefficient, or to suppress the crystallization.

It is effective for further preventing or suppressing crystallization to contain $WO_3$, $MoO_3$, $ZnO$, $BaO$, $SrO$ and $CaO$, for improving the moisture resistance and the water resistance to contain $MnO_2$, $BaO$, $SrO$ and $CaO$, for decreasing the heat expansion coefficient to contain $ZnO$, and for decreasing the temperature of the transition point T and the softening point $T_s$ to contain $MoO_3$. On the other hand, $MnO_2$ is an ingredient that promotes crystallization, BaO, SrO and CaO are ingredients that increase the transition point $T_g$ and the softening point $T_s$, $MoO_3$, BaO, SrO and CaO are ingredients that increase the heat expansion coefficient, and $MoO_3$ and ZrO are ingredients that lower the moisture resistance and she water resistance.

Accordingly, containing $WO_3$, $MoO_3$, $MnO_2$, $ZnO$, $BaO$, $SrO$ and $CaO$ has advantages and disadvantages respectively, and the ingredients and the contents thereof should be determined while taking a sufficient consideration for the characteristics of the basic composition consisting of $V_2O_5$, $TeO_2$, $Fe_2O_3$ and $P_2O_5$.

Based on the premise of satisfying the conditions described above, a particularly effective compositional ranges of the low melting glass are 35 to 50 mass % of $V_2O_5$, 20 to 35 mass % of $TeO_2$, 10 to 20 mass % of $Fe_2O_3$, 4 to 15 mass % of $P_2O_5$, and 0 to 10 mass % of one or more of $WO_3$, $MoO_3$, $MnO_2$, $ZnO$, $BaO$, $SrO$ and $CaO$ in total in terms of oxides.

$V_2O_5$ at 35 mass % or more can provide easy softening and fluidization by the laser irradiation at the wavelength in a range from 400 to 1100 nm. When the content is 50 mass % or less, reliability such as the moisture resistance, the water resistance, etc. is improved. When $TeO_2$ is at 20 mass % or more, the glass is less crystallized, the transition point $T_g$ and the softening point $T_s$ are lowered and reliability such as the moisture resistance and the water resistance is further improved. When $TeO_2$ is at 35 mass % or less, the low melting glass can be prevented from fracture before the softening and fluidization by heat shock under the laser irradiation since the heat expansion coefficient is not increased excessively.

When $Fe_2O_3$ is at 10 mass % or more, the reliability such as the moisture resistance and the water resistance is improved. In addition, an effect of decreasing the thermal expansion can be obtained. Further, a glass bonded portion of high reliability can be obtained in the laser sealing step after atmospheric sintering. When $Fe_2O_5$ is at 20 mass % or less, crystallization can be suppressed. When $P_2O_5$ is at 4 mass % or more, the glass is less crystallized. In addition, the glass tends to be softened and fluidized by the laser irradiation. When $P_2O_5$ is at 15 mass % or less, the transition point $T_g$ and the softening point. $T_s$ are lowered and the glass can be softened and fluidized readily by the laser irradiation. Further, the reliability such as the moisture resistance and the water resistance is also improved.

Further, it is effective for the above-mentioned low melting glass that the transition point $T_g$ is 350° C. or lower and the softening point $T_s$ is 410° C. or lower. As will, be described specifically later, the transition point $T_g$ and the softening point $T_s$ referred to herein are temperature characteristics by a differential thermal analysis (DTA), in which the transition point $T_g$ is a starting temperature of the first endothermic peak and the softening point T is a temperature of a second endothermic peak. If the transition point $T_g$ exceeds 350° C., large residual strains may sometimes occur under laser sealing accompanying rapid heating and cooling. Further, if the softening point $T_s$ exceeds 410° C., the glass is less softened and fluidized readily under laser irradiation. Further, it is effective that the low melting glass has a heat expansion coefficient at 30 to 250° C. of $100\times10^{-7}$/° C. or less. If the heat expansion coefficient exceeds $100\times10^{-7}$/° C., cracks may sometimes occur by the heat shock under the laser irradiation.

Further, in the present invention, the sealing material 5 in the electronic component illustrated in FIG. 1 and FIG. 2 may also contain filler particles for decreasing the heat expansion coefficient in addition to the low melting glass. The filler particle is preferably one or more of zirconium phosphotungstate $(Zr_2(WO_4)(PO_4)_2)$, niobium oxide $(Nb_2O_5)$, and β-eucryptite $(LiAlSiO_4)$. Since such filler particles have a heat expansion coefficient remarkably smaller than that of the low melting glass and have good wettability and adhesivity with the low melting glass in addition, the heat expansion coefficient as the sealing material 5 can be decreased.

For the effect of lowering the heat expansion coefficient of the sealing material 5, it is most effective to contain the filler particles of $Zr_2(WO_4)(PO_4)_2$. Further, it is particularly effective that the filler particle contains iron tungstate $(FeWO_4)$ and zirconium phosphate $(ZrO(PO_4)_2)$. $Zr_2(WO_4)(PO_4)_2$ filler particles containing $FeWO_4$ and $ZrO(PO_4)_2$ can absorb a laser at a wavelength in a range from 400 to 1100 nm and can generate heat. In view of the above, the low melting glass and the filler can be heated simultaneously by the laser irradiation, which provides a significant advantage capable of providing effective laser sealing and obtaining a glass bonded portion of high reliability.

When the content of the filler particles in the sealing material 5 is 35 parts by volume or less based on 100 parts by volume of the low melting glass, the softening and fluidizing property of the low melting glass in the sealing material can be maintained and a firm bonding can be obtained under the laser irradiation.

Further, in the electronic component of the invention illustrated in FIG. 1, the thickness of the bonded layer comprising the sealing material 5 is preferably 20 μm or less. When the thickness is 20 μm or less, the glass shows good softening and fluidizing property throughout relative to the direction of the thickness of the sealing material 5 since the low melting glass contained in the sealing material 5 on the side remote from the transparent substrate irradiated with laser can also be softened and fluidized sufficiently. Further, when the distance between the two transparent substrates 1 and 2 is large and particularly when the distance is 100 μm or more in the electronic component illustrated in FIG. 2, they are preferably bonded by way of a spacer 6. The thickness of the bonded layer in this case is preferably 20 μm or less together with the sealing material 5, 5' in the same manner as described above.

Further, in the electronic component of the present invention illustrated in FIG. 1 and FIG. 2, the transparent substrates 1 and 2 and the spacer 6 are made of a glass or a resin. Since they are transparent to the wavelength at 400 to 1100 nm, they have low absorptivities and high transmittances to the wavelength at 400 to 1100 nm. Accordingly, even when they are irradiated by the laser at the wavelength in the range from 400 to 1100 nm, they are scarcely heated, and allow the laser to transmit therethrough, and can be irradiated only for the sealing material 5 or 5' at a desired portion. Since the low melting glass contained in the sealing material 5 or 5' irradiated with the laser is softened and fluidized, the outer peripheral portions of the transparent substrate 1 and 2 can be bonded.

As described above, the present invention is generally applied effectively to a display containing an organic light emitting diode, a dye-sensitized solar cell containing an organic dye, and a solar cell containing a photoelectronic conversion element and being bonded by a resin, for example. Further, the present invention is not restricted only to the electronic component described above but is applicable also to a case in which an element and a material of low heat resistance is used to the inside of the electronic component and is not restricted only to the electronic component described above.

Further, the present invention provides a sealing material paste containing a powder of the low melting glass, a resin binder and a solvent. The particle diameter of the low melting glass is preferably 3 μm or less as a mean particle diameter. Ethyl cellulose or nitrocellulose is preferred as the resin powder, and butyl carbitol acetate is preferred as the solvent. Instead of the resin binder and the solvent, α-terpineol which is a high viscosity solvent can also be used. Further, the sealing material paste may also contain the filler particles. The particle diameter of the filler particle as a mean particle diameter is preferably larger than the mean particle diameter of the low melting glass. When the content of the filler particles is 35 parts by volume or less based on 100 parts by volume of the powder of the low melting glass, firm bonding is obtained.

Then, a method for producing the electronic component of the present invention is to be described.

Figure 3:
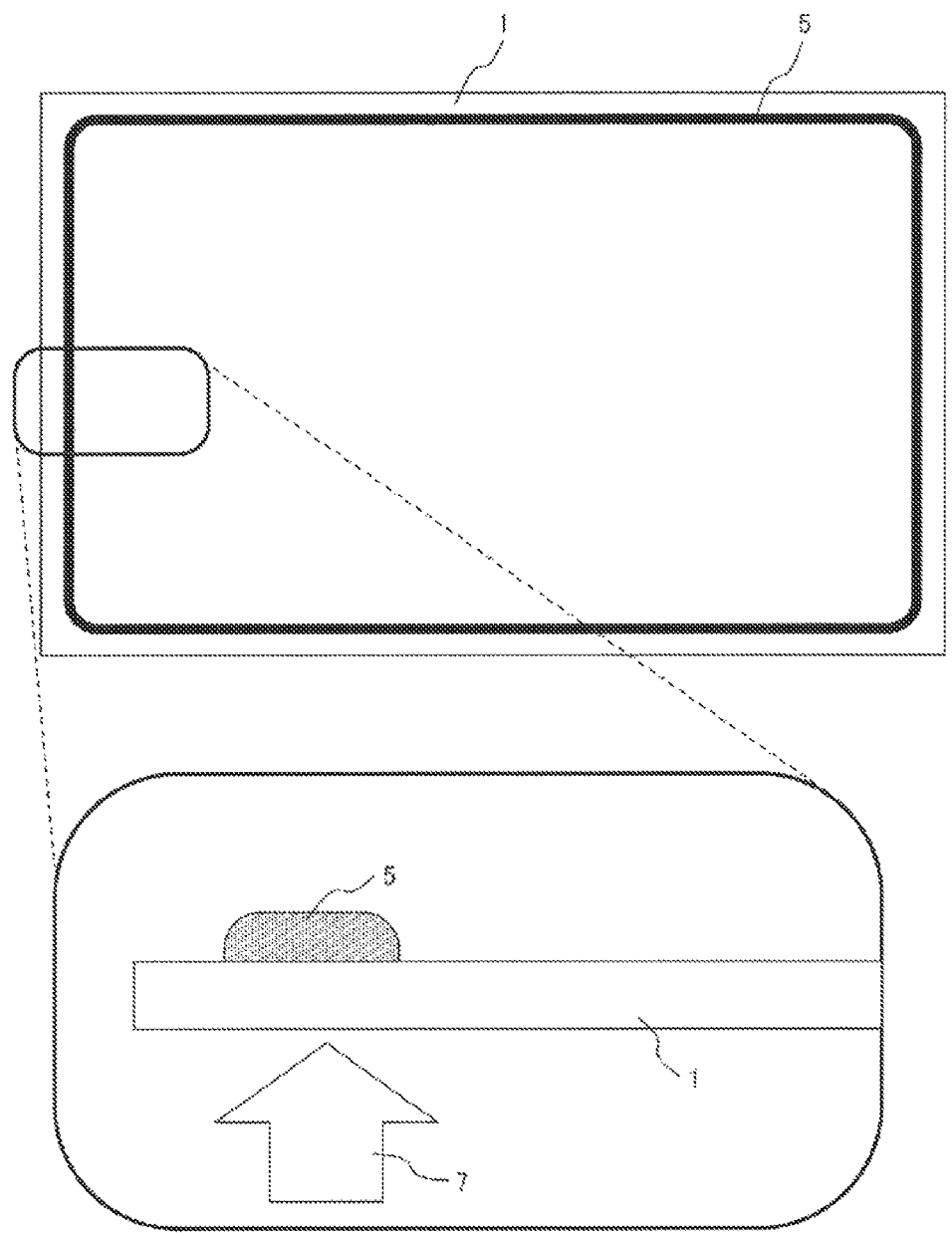
FIG. 3 is an example of a schematic view of a method for producing the electronic component illustrated in FIG. 1.
Figure 4:
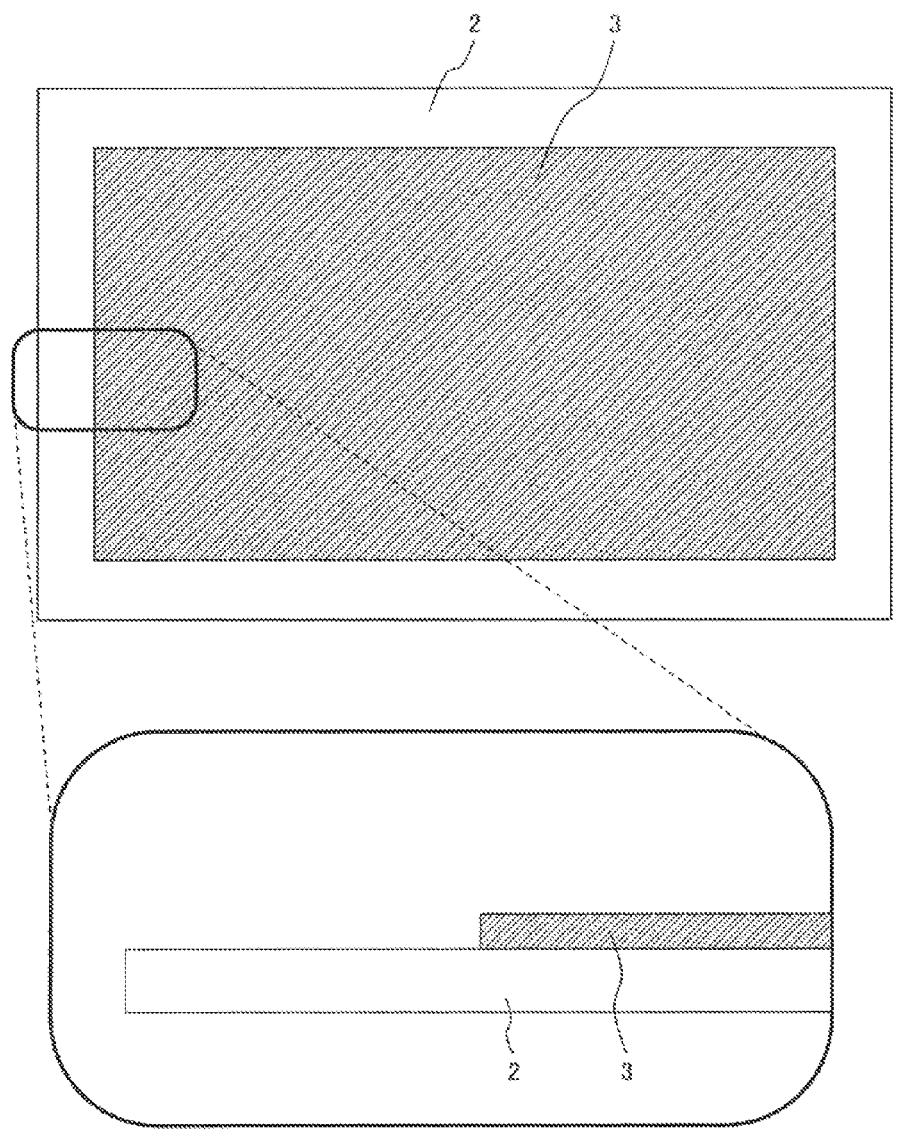
FIG. 4 is an example of a schematic view of a method for producing the electronic component illustrated in FIG. 1.
Figure 5:
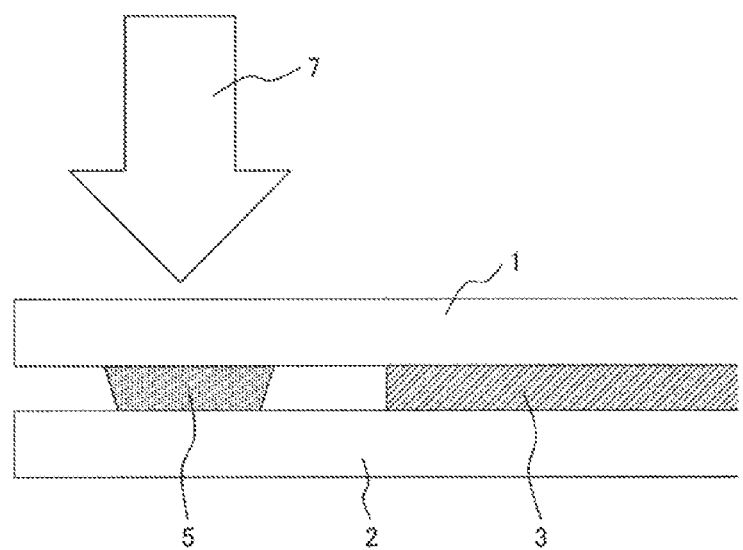
FIG. 5 is an example of a schematic view of a method for producing the electronic component illustrated in FIG. 1.

A producing method for the electronic component illustrated in FIG. 1 is illustrated simply in FIGS. 3 to 5.

As illustrated in FIG. 3, a sealing material 5 containing a low melting glass is formed on the outer peripheral portion of a transparent substrate 1. In the method of formation, a sealing material paste as the sealing material 5 is first coated by a screen printing method or a dispenser method and dried to the outer peripheral portion of the transparent substrate 1. When a glass substrate is used for the transparent substrate 1, the low melting glass contained in the sealing material 5 is softened and fluidized by a sintering furnace or by irradiation of a laser 7 at a wavelength in a range from 400 to 1100 nm and sintered and formed on the transparent substrate 1. When a resin substrate is used for the transparent substrate 1, the sealing material 5 is sintered and formed on the outer peripheral portion of the transparent substrate 1 by irradiation of the laser 7 since the heat resistance of the resin is low and the sintering furnace cannot be used.

Then, the other transparent substrate 2 formed with one or more organic member 3 is prepared as illustrated in FIG. 4. The transparent substrate 2 may be either a glass substrate or a resin substrate but it is preferred that the material thereof is identical with that of the transparent substrate 1.

Then, the surface of the transparent substrate 1 formed with the sealing material 5 and the surface of the transparent substrate 2 formed with the organic member 3 are opposed, positions of the two transparent substrates 1 and 2 are adjusted, and the organic member 3 is disposed in an inner space surrounded by the transparent substrates 1, 2 and the sealing material 5, as illustrated in FIG. 5. When the transparent substrate 1 coated with the sealing material 5 is sintered by the laser irradiation, the organic member 3 may be formed on the transparent substrate 1 since portions other than the outer peripheral portion of the transparent substrate 1 are less heated. A laser 7 at a wavelength in a range from 400 to 1100 nm is applied through the transparent substrate to the sealing material 5. The laser 7 may be applied from the outside of any transparent substrate to the sealing material 5, but sealing can be performed at a higher efficiency by the laser irradiation from the outside of the transparent substrate 2 to the sealing material 5 since the sealing material 5 is formed previously to the transparent substrate 1. In this case, care should be taken so that the organic member 3 disposed in the electronic component is not irradiated with the laser 7. This is because the organic member 3 is possibly damaged or deteriorated by irradiation of the laser 7. By irradiation of the laser 7, the low melting glass contained in the sealing material 5 is softened and fluidized to bond the outer peripheral portions of the two transparent substrates 1 and 2.

Figure 6:
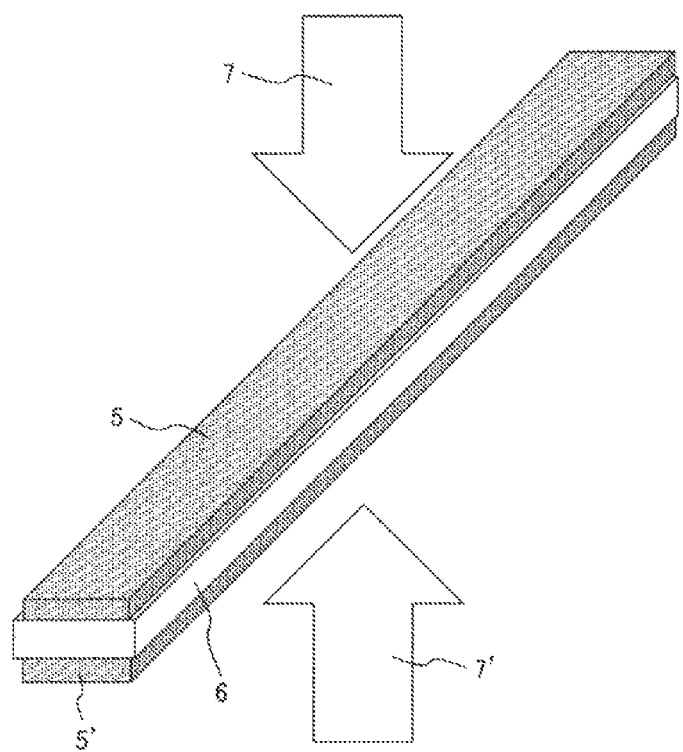
FIG. 6 is an example of a schematic view of a method for producing the electronic component illustrated in FIG. 2.
Figure 7:
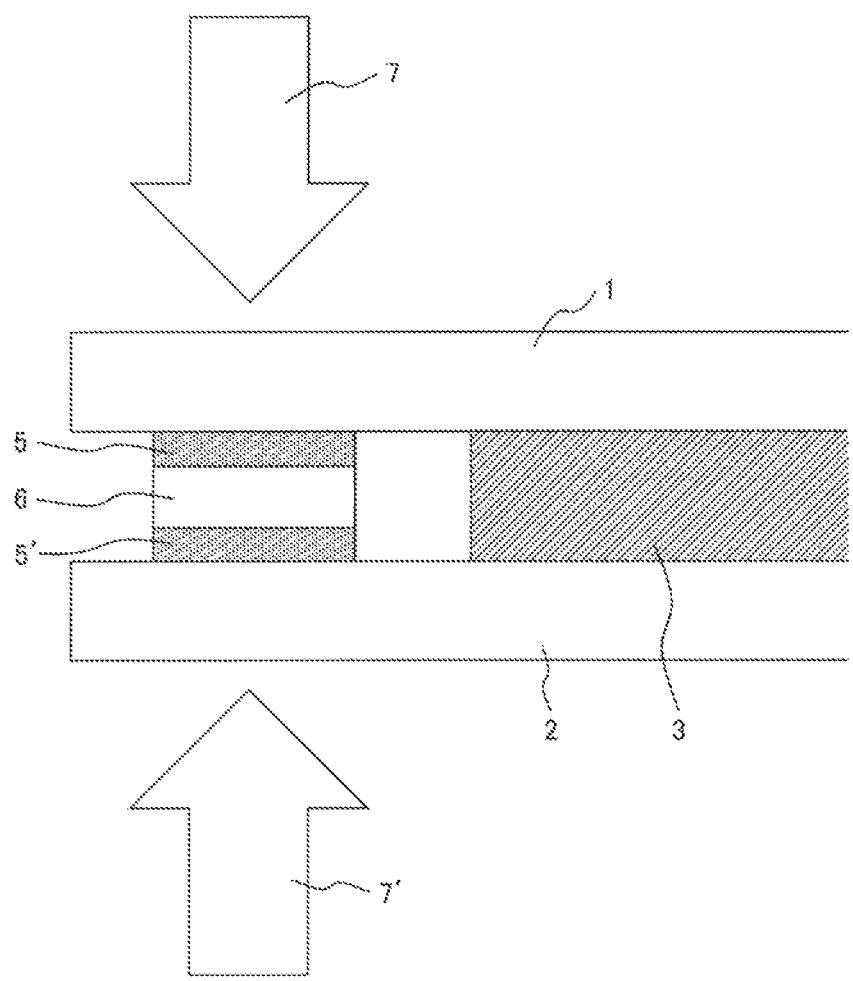
FIG. 7 is an example of a schematic view of a method for producing the electronic component illustrated in FIG. 2.

A method of producing the electronic component illustrated in FIG. 2 is simply shown in FIG. 6 and FIG. 7

As illustrated in FIG. 6, sealing materials 5 and 5 are formed at least on the bonding surfaces of the spacer 6. The sealing material paste as the sealing materials 5 and 5' is coated at least on the bonding surface of the spacer 6 bonded to the transparent substrate and is dried. In a case of using the glass spacer 6, a low melting glass contained in the sealing materials 5 and 5' is softened and fluidized by a sintering furnace or by irradiation of lasers 7, 7' at a wavelength in a range from 400 to 1100 nm, and the sealing material is sintered and formed on the spacer 6. In a case of using a resin spacer 6, the sealing material 5 is sintered and formed on the spacer 6 by the irradiation of the lasers 7 and 7' since the heat resistance of the resin is low and the sintering furnace cannot be used.

The spacer 6 on which the sealing materials 5 and 5' is formed is disposed and secured at the outer peripheral portions of a space between the transparent substrate 1 and the other transparent substrate 2 formed with one or more of organic members 3 are opposed, as illustrated in FIG. 7. And lasers 7, 7' at a wavelength in a range from 400 to 1100 nm are applied to the sealing materials 5 and 5' through the transparent substrates. In this case, care should be taken so that the lasers 7 and 7' are not applied to the organic element 3 or the organic material 4 disposed in the electronic component in the same manner as described above. When the sealing materials 5 and 5' are irradiated by the lasers 7 and 7', the low melting glass contained in the sealing materials 5 and 5' is softened and fluidized to bond the outer peripheral portions of the two transparent substrates 1 and 2. The transparent substrate 1 and 2 may be either a glass substrate or a resin substrate so long as the reflectance is low and the transmittance is high at the wavelength in the range from 400 to 1100 nm.

As described above, the electronic component and the producing method thereof, as well as the sealing material paste used therefor according to the present invention, an electronic component can be produced efficiently without giving thermal damages to the organic element or the organic material disposed in the electronic component. In addition, a glass bonding layer excellent in bondability, gas barrier property (airtightness), and moisture resistance and water resistance can be obtained.

Hereinafter, the present invention is to be described more specifically by way of examples. However, the present invention is not restricted to the descriptions of the examples referred to therein but they may be combined appropriately.

EXAMPLE 1

In this example, compositions and characteristics of low melting glasses contained in a sealing material were investigated. Tables 1 to 4 show examples and Table 5 shows comparative examples. For manufacturing low melting glasses illustrated in Tables 1 to 5, reagents of $V_2O_5$, $TeO_2$, $Fe_2O_3$, $P_2O_5$, $WO_3$, $MoO_3$, $MnO_2$, ZnO, $SrCO_3$, $BaCO_3$ and $CaCO_3$ manufactured by Kojundo Chemical Laboratory Co., Ltd. were used as raw materials. The materials were used and blended and mixed by predetermined amounts so as to be 300 g in total, charged in a platinum crucible, and heated to 900° C. and melted at a temperature elevation rate of 5 to 10° C./min by an electric furnace. They were kept for 2 hours while stirring at that temperature in order to form homogeneous glasses. Then, the crucible was taken out and the molten glass was cast onto a stainless steel sheet previously heated to 150 to 200° C. to prepare low melting glass.

The prepared low melting glass was pulverized by a jet mill to a mean particle diameter of 3 µm or less. By using the powder, a transition point ($T_g$), a yield point ($M_g$), a softening point ($T_s$), and a crystallization temperature ($T_{cry}$) were measured by performing differential thermal analysis (DTA) to 500° C. at a temperature elevation rate of 5° C./min. An alumina ($Al_2O_3$) powder was used as a standard sample.

Figure 8:
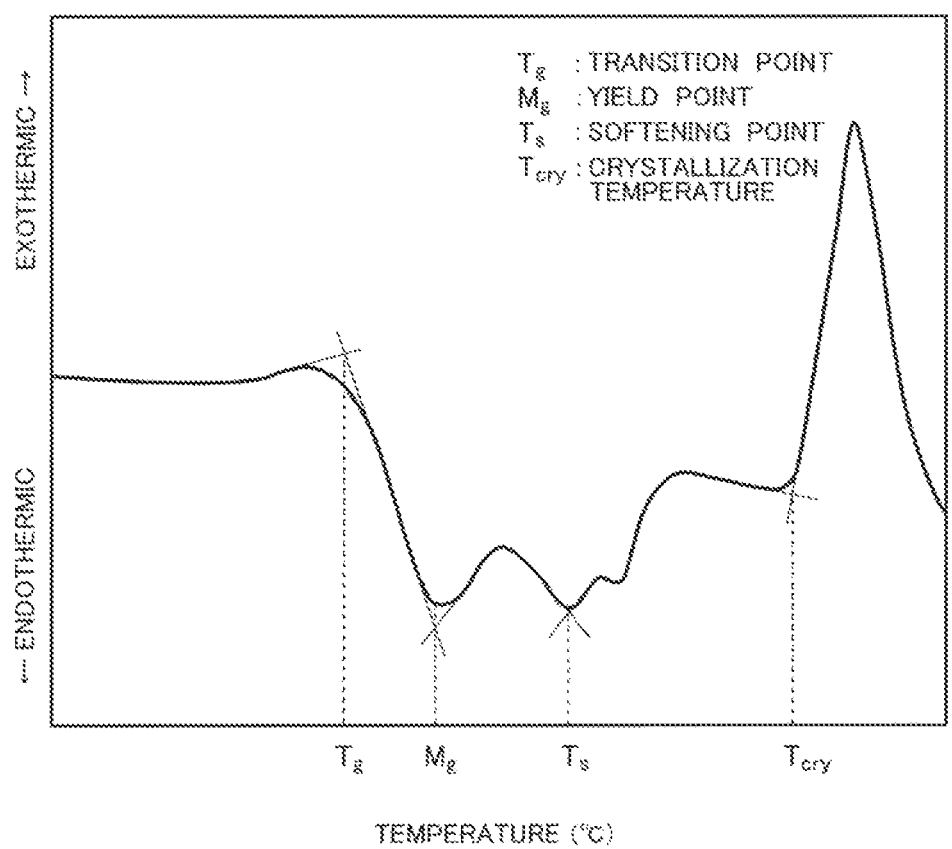
FIG. 8 is an example of a DTA curve obtained by a differential thermal analysis (DTA) of a typical low melting glass.

FIG. 8 shows a DTA curve of typical low melting glass. As shown in FIG. 8, $T_g$ is a starting temperature for a first endothermic peak, $M_g$ is a peak temperature thereof, $T_s$ is a second endothermic peak temperature, and $T_{cry}$ is a starting temperature for an exothermic peak by crystallization. Characteristic temperature of glass is defined by viscosity and it is said that $T_g$, $M_g$ and $T_s$ temperatures corresponding to $10^{13.3}$ Poise, $10^{11.8}$ and $10^{7.65}$ Poise, respectively. For softening and fluidizing the glass at a low temperature, it is necessary to lower $T_s$ as much as possible. Further, it is preferred to lower $T_g$ as much as possible in order to moderate a thermal residual strain. $T_{cry}$ is a temperature at which the glass starts to crystal. In the crystallization, it is desired that $T_{cry}$ is on a higher temperature side than $T_s$ as much as possible since crystallization hinders softening and fluidization of glass.

Thermal strain was removed from the prepared low melting glass within a temperature range of $T_g$ to $M_g$ and fabricated into a square pole of 4×4×20 mm. Using the pole, a heat expansion coefficient at 30 to 250° C., a transition temperature $T_G$, and a deformation temperature $A_T$ were measured by a thermal expansion meter. The temperature elevation rate was set to 5° C./min. A quartz glass cylinder of φ5×20 mm was used as a control sample.

Figure 9:
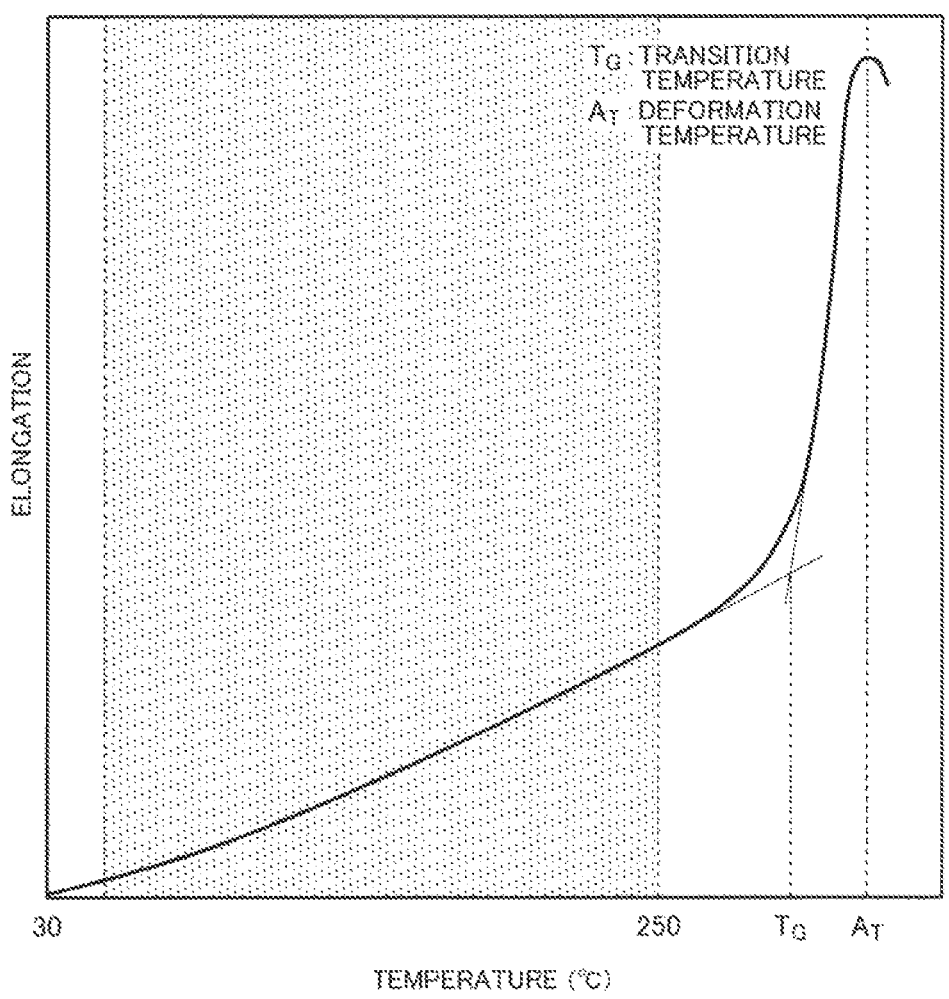
FIG. 9 is an example of a thermal expansion curve of a typical low melting glass.

FIG. 9 shows a thermal expansion curve of typical low melting glass.

In FIG. 9, an elongation amount of the quartz glass as the control sample is subtracted. The heat expansion coefficient was calculated based on the gradient of the elongation amount in a temperature range of 30 to 250° C. $T_G$ is a temperature at which elongation starts remarkably, and $A_T$ is a temperature at which the sample is deformed under a load. $T_G$ was measured somewhat higher than $T_g$ of DTA. $A_T$ was between $M_g$ and $T_s$ in the DTA curve.

A saturated pressure cooker test (at a temperature of 120° C. and a humidity of 100% Rh, and under a pressure 202 kPa) was used for moisture resistance test of the prepared low melting glass, and a sample which applied a mirror-like finishing to a surface thereof for the evaluation of thermal expansion was used as a sample for evaluating the moisture resistance. For the evaluation of the moisture resistance, an saturated pressure cooker test was performed for three days, and evaluated as "◯" in a case where a gloss on the surface of the mirror finished glass was maintained, as "Δ" (a triangle) in a case where the gloss was lost, and as "×" in a case where the glass was fractured.

A sintered glass body was obtained by applying a compaction molding to a glass powder which is pulverized by a let mill in a hand press (1 ton/cm²), and sintering a molded body at a temperature near the softening point in atmospheric air for 2 hours. The softening and fluidizing property of the prepared low melting glass was evaluated applying various types of lasers to the sintered glass body though a transparent substrate.

Figure 10:
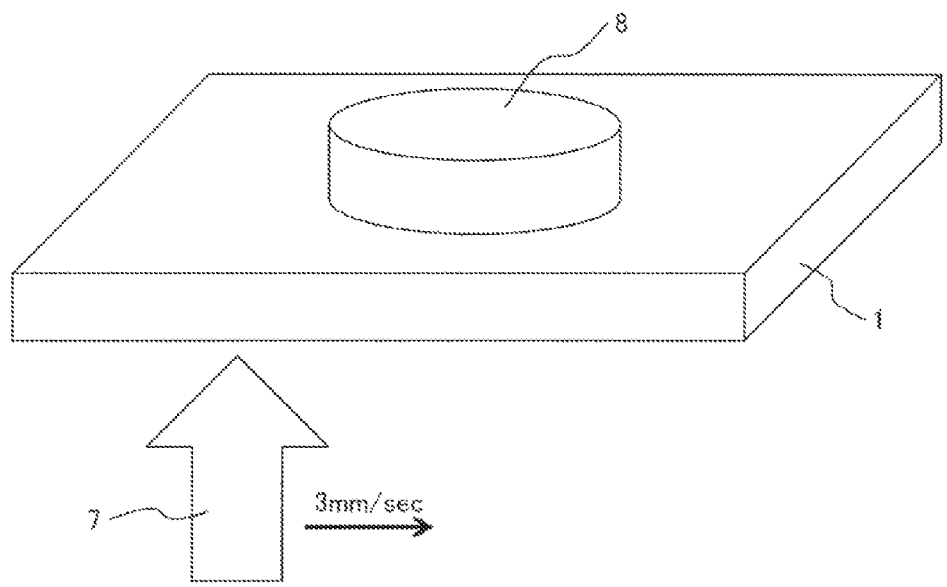
FIG. 10 is a schematic view of a laser irradiation experiment to a compact glass molding product.

FIG. 10 illustrates an outline of laser irradiation experiment.

The size of a compact molded glass body was φ20×1 to 2 mm. A sintered glass body after sintering shrank to about 90%. The sintered glass body 8 was placed on a transparent substrate 1 and a laser 7 was caused to transfer at a velocity of 3 mm/sec from a rear side to the sintered glass body 8 under the irradiation. A slide glass was used for the transparent substrate 1. For the laser 7, a semiconductor laser at a wavelength of 405 nm, a second harmonic wave of YAG laser at 532 nm, a semiconductor laser at 630 nm, a semiconductor laser at 805 nm, and a YAG laser at 1064 nm were used.

The softening and fluidizing property was evaluated as "◯" when the laser irradiated portion of the compact molded glass body 8 was fluidized, as "□" when the compact molded glass body was fluidized but crack was generated, as "Δ" when the compact molded glass body was softened, as "∇" (an inverted triangle) when the compact molded glass body was softening but cracks were generated, and as "×" when the compact molded glass body was neither fluidized nor softened. The softening and fluidizing property of the laser irradiated portion of the compact molded glass body 8 was judged under observation by an optical microscope through the transparent substrate 1.

As can be seen from Examples G1 to 33 shown in Tables 1 to 3 and Comparative Examples G34 to 44 shown in Table 4, the low melting glasses in Examples G1 to 33 showed softening point $T_s$ lower than that of the low melting glasses in Comparative Examples G42 and 44, showed heat expansion coefficient smaller than that of the low melting glasses of Comparative Examples G36 to 39, 41 to 43, and 44 and, further, showed better moisture resistance than that of any of low melting glasses in the comparative examples. Further, the low melting glasses in Examples G1 to 33 showed good softening and fluidizing property by irradiation of any laser.

The low melting glasses in Examples G1 to 33 contained vanadium oxide, tellurium oxide, iron oxide and phosphorous oxide, in which the content of $V_2O_5$, $TeO_2$, $Fe_2O_3$ and $P_2O_5$ in total was 90 mass % or more in terms of oxides and they were in a relation of $V_2O_3 > TeO_2 > Fe_2O > P_2O_5$ (mass %). Further, one or more of tungsten oxide, molybdenum oxide, manganese oxide, zinc oxide, barium oxide, strontium oxide and calcium oxide may also be contained as glass ingredients and they were in the following relation in terms of oxides. $WO_3 + MoO_2 + MnO_2 + ZnO + BaO + SrO + CaO \le 10$ mass %

A particularly effective compositional range on the premise of satisfying the conditions is 35 to 50 mass % of $V_2O_5$, 20 to 35 mass % of $TeO_2$, 10 to 20 mass % of $Fe_2O_3$, 4 to 15 mass % of $P_2O_5$, and 0 to 10 mass % of one or more of $WO_3$, $MoO_3$, $MnO_2$, ZnO, SrO, BaO and CaO in total in term of oxides.

Further, the low melting glasses in Examples G1 to 33 was efficiently absorbed a laser at a wavelength in the range from 400 to 1100 nm and was heated. In addition, since the softening point $T_s$ was as low as 410° C. or lower, they showed a good softening and fluidizing property. Further, since the transition point $T_g$ was as low as 350° C. or lower and the heat expansion coefficient was relatively small as $100 \times 10^{-7}/°$ C. or less, they were less cracked due to heat shocks by the laser irradiation.

EXAMPLE 2

In this example, a laser sealing experiment was performed by using the low melting glass in Example G12 shown in Table 2 and a slide glass as a transparent substrate. A sealing material paste was prepared by using a powder of the low melting glass of G12 pulverized to a mean particle diameter of 3 μm or less by a jet mill, a resin binder and a solvent. Nitrocellulose was used as the resin binder and butyl carbitol acetate was used as the solvent.

Figure 11:
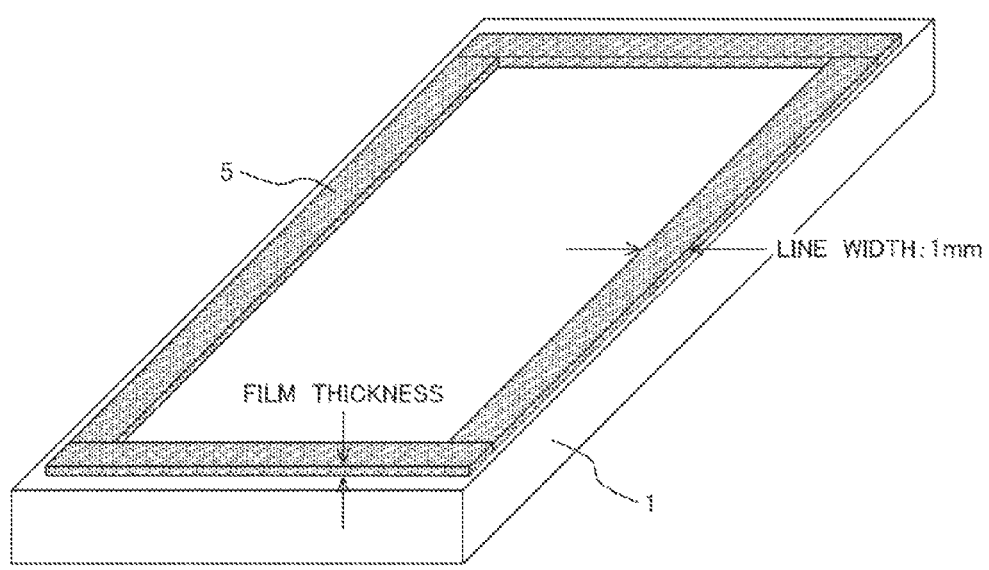
FIG. 11 is a schematic view for a state in which a glass paste for a laser sealing is coated.

The sealing material paste was used and coated to the outer peripheral portion of a transparent substrate by a dispenser method as illustrated in FIG. 11, and drying it and thereafter sintered in an atmospheric air at 400° C. for 30 minutes. The line width of the sealing material 5 formed on the transparent substrate 1 was set to 1 mm, and the thickness of the sintered film was adjusted so as to be about 5, 10, 20, 30 μm respectively by changing the coating amount.

Figure 12:
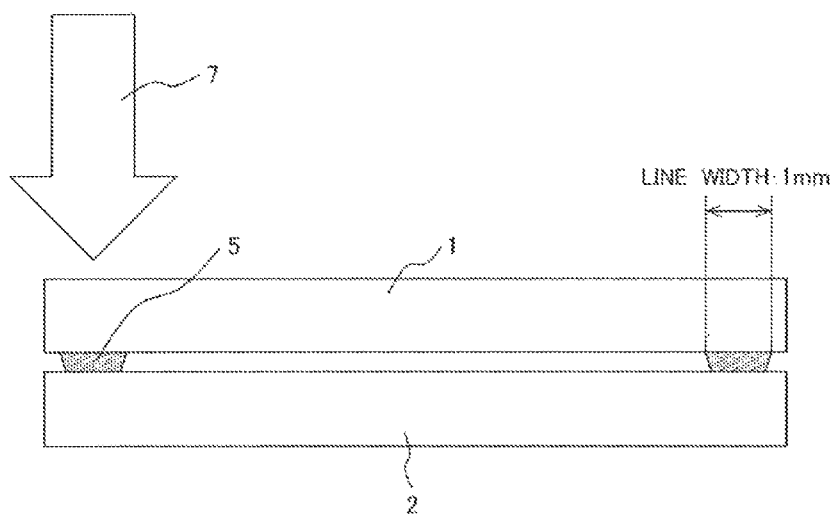
FIG. 12 is a schematic cross sectional view illustrating a state of a laser irradiation.

As illustrated in FIG. 12, a transparent substrate 2 was opposed, and a laser 7 was applied while transferring in the direction from the transparent substrate 1 to the sealing material 5 at a velocity of 12 mm/sec to bond the outer peripheral portions of the transparent substrates 1 and 2. As the laser 7, four types of lasers used in Example 1 were used. Each of the samples could be bonded and the airtightness (gas barrier property) and the bondability were evaluated. Table 5 shows the result of the evaluation.

For the airtightness (gas barrier property), a helium leak test was performed and the sample was evaluated as "◯" when leak did not occur and as "×" when leak occurred. Further, for the bondability, a peeling test was performed and evaluated as "◯" when the transparent substrate or the sealing material was fractured, and evaluated as "×" when peeling occurred readily from the interface between the transparent substrate and the sealing material. When the thickness of the sintered film was 20 μm or less, the airtightness and the bondability were satisfactory by using any laser. However, good airtightness and bondability could not sometimes be obtained depending on the laser used at the sintered film thickness of 30 μm. A YAG laser was used for the wavelength of 532 nm and 1064 nm and it is considered that good airtightness and bondability could be obtained since the power is higher than that of other semiconductor layers. Since the semiconductor laser is extremely inexpensive compared with the YAG laser, use of the semiconductor laser is preferred for laser sealing and the thickness of the bonded layer is preferably 20 μm or less.

However, when the laser was applied from both surfaces of the transparent substrates 1 and 2, good airtightness and bondability were obtained even at the thickness of the sintered film of 30 μm. That is, in a case where the thickness of the bonded layer is large, such a method may be possibly used sufficiently as a countermeasure.

Figure 13:
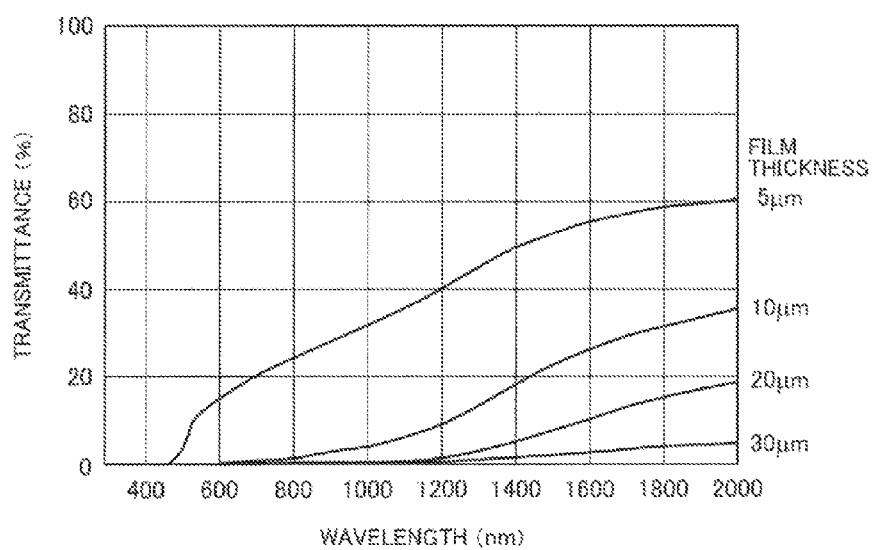
FIG. 13 is an example of a transmittance curve of a typical low melting glass.

FIG. 13 shows a transmittance curve of a coated membrane formed by sintering the low melting glass of Example G12.

In a wavelength region from 300 to 2000 nm, the transmittance was lower as the wavelength was shorter and the transmittance was lowered as the thickness of the sintering film was larger. Since low melting glasses of other examples shown in Tables 1 to 3 also have identical transmittance curves, it is apparent that an identical effect can be obtained.

EXAMPLE 3

In this example, the laser sealing experiment was performed in the same manner as in Example 2 by using a polycarbonate for the transparent substrate. Since the heat resistance of the polycarbonate is lower than that of the low melting glass of G12, a semiconductor laser at a wavelength of 805 nm was used when sintering was applied previously to the transparent substrate. When the laser was used, a sintered coating film of G12 was obtained while scarcely heating the polycarbonate. In order to decrease foaming, the sealing material paste was prepared only from α-terpineol as a high viscosity solvent and the glass powder of G12 without using the resin binder.

As illustrated in FIG. 12, outer peripheral portions of the polycarbonate as the transparent substrates 1 and 2 were bonded by the irradiation with various types of lasers and the bondability was evaluated in the same manner as in Example 2. The same effect as in the case of using the glass for the transparent substrates 1 and 2 was obtained. In this example, while the polycarbonate was used as the transparent substrate, it will be apparent that another material than the polycarbonate can also be applied so long as the resin substrate is transparent.

EXAMPLE 4

In this example, a laser sealing experiment identical with that of Example 2 was performed by using a borosilicate glass substrate having a heat expansion coefficient of $50 \times 10^{-7}/°$ C. as a transparent substrate, Example G19 shown in Table 2 as the low melting glass contained in the sealing material, and zirconium phosphotungstate ($Zr_2(WO_4)(PO_4)_2$), niobium oxide ($Nb_2O_5$) and β-eucryptite (LiAlSiO$_4$) as the filler particles for decreasing the heat expansion coefficient of the sealing material.

First, a sealing material paste was prepared by using a powder of the low melting glass of G19 pulverized to a mean particle diameter of 3 μm or less by a jet mill, the filler particles of $Zr_2(WO_4)(PO_4)_2$, $Nb_2O_5$ or LiAlSiO$_4$ with a mean particle diameter of about 5 μm, a resin binder, and a solvent. Further, the content of the filler particles was set to 15, 25, 35 and 45 parts by volume based on 100 parts by volume of the low melting glass of G19 respectively. The density of the low melting glass G19 used was 3.67 g/cm$^3$, the density of $Zr_2(WO_4)(PO_4)_2$ was 3.80 g/cm$^3$, the density of $Nb_2O_5$ was 4.57 g/cm$^3$, and the density of LiAlSiO$_4$ was 2.42 g/cm$^3$. Further, ethyl cellulose was used as the resin binder and butyl carbitol acetate was used as the solvent. The sealing material paste was used and coated to the outer peripheral portion of the transparent substrate by the screen printing method as illustrated in FIG. 11, and dried it, thereafter sintered in atmospheric air at 420° C. for 15 minutes. The sealing material 5 formed to the transparent substrate 1 had a line width of 1 mm and a film thickness of 10 to 13 μm.

As illustrated in FIG. 12, a transparent substrate 2 was opposed and a semiconductor laser 7 at a wavelength of 805 nm was applied in the direction from the transparent substrate 1 to the sealing material 5 while transferring at a velocity of 12 mm/sec to bond the outer peripheral portions of the transparent substrates 1 and 2. The airtightness (gas barrier property) and the bondability were evaluated in the same manner as in Example 2. Table 6 shows the result of the evaluation.

If the filler particles were not contained in the sealing material 5, the difference of thermal expansion between the glass substrate used for the transparent substrate 1 and 2 and the Low melting glass G19 was large, cracks occurred and no satisfactory airtightness could be obtained. However, in spite of the occurrence of the cracks, the bondability was satisfactory. When the filler particles of $Zr_2(WO_4)(PO_4)_2$, $Nu_2O_5$ or $LiAlSiO_4$ were contained, the heat expansion coefficient as the sealing material 5 decreased and good airtightness could be obtained. This is because the difference of the thermal expansion from that of the glass substrate used as the transparent substrates 1 and 2 was decreased and occurrence of the cracks was prevented. Further, good bondability was also obtained when the content of the filler particles was up to 35 parts by weight. However, if the content of the filler particles increased to 45 parts by volume, the bondability was deteriorated although good airtightness was maintained. This is because the content of the low melting glass G19 for bonding the transparent substrates 1 and 2 decreased if the filler particles were excessive.

Further, when $Zr_2(WO_4)(PO_4)_2$ was used among the filler particles of $Zr_2(WO_4)(PO_4)_2$, $Nb_2O_5$ and $LiAlSiO_4$, this was dispersed most uniformly in the low melting glass G19 and showed a high bonding force as well. This is considered to be attributable to that the wettability with the low melting glass G19 is satisfactory and the density was close to that of the glass.

In view of the above, it is considered that the content of the filler particles contained in the sealing material 5 is preferably 3.5 parts by volume or less based on 100 parts by volume of the low melting glass 100 in order to bond the transparent substrates 1 and 2 airtightly and firmly by the laser. In this example, $Zr_2(WO_4)(PO_4)_2$, $Nb_2O_5$ and $LiAlSiO_4$ were selected and investigated as the filler particles. However, they are not restrictive but cordielite, zirconium phosphate, zirconium silicate, etc. having small heat expansion coefficient may also be used possibly.

EXAMPLE 5

It was found in view of Example 4 that the use of $Zr_2(WO_4)(PO_4)_2$ was preferred among the filler particles of $Zr_2(WO_4)(PO_4)_2Nb_2O_5$, and $LiAlSiO_4$. Then, in this example, $Zr_2(WO_4)(PO_4)_2$ filler particles that can be heated by the laser irradiation were investigated. A small amount of iron tungstate ($FeWO_4$) and zirconium phosphate ($ZrO(PO_4)_2$) were precipitated in the $Zr_2(WO_4)(PO_4)_2$ filler particles. Precipitation of $FeWO_4$ and $ZrO(PO_4)_2$ in the $Zr_2(WO_4)(PO_4)_2$ filler particles was confirmed by X-ray diffractometry. It was found that $FeWO_4$ could absorb the laser and cause the $Zr_2(WO_4)(PO_4)_2$ filler particles to generate heat. $ZrO(PO_4)_2$ is an auxiliary precipitation product formed by precipitation of $FeWO_4$ in the $Zr_2(WO_4)(PO_4)_2$ filler particles. An experiment identical with that in Example 4 was performed by using $Zr_2(WO_4)(PO_4)_2$ filler particles containing $FeWO_4$ and $ZrO(PO)_2$ and the low melting glass G16 in Table 2. The content of the filler particles was set to 35 parts by volume based on 100 parts by volume of the low melting glass of G16.

As a result of the investigation identical with that in Example 4 by using the $Zr_2(WO_4)(PO_4)_2$ filler particles containing $FeWO_4$ and $ZrO(PO_4)_2$, the substrates were bonded more firmly than in the case of using the $Zr_2(WO_4)$ $(PO_4)_2$ filler alone. Further, as a result of the investigation when the transfer velocity of the laser was increased, good bondability was obtained up to a velocity of 30 mm/sec in a case of using the filler particles of this example, while the substrates could be bonded at a velocity up to 15 mm/sec in a case of using the filler particles of $Zr_2(WO_4)(PO_4)_2$ alone. The low melting glass was heated so far upon the laser irradiation, but there may be a possibility that the heat was deprived by the filler particles. It is considered that the softening and fluidizing property of the sealing material was improved greatly by the laser irradiation and the laser transfer velocity could be increased remarkably by efficient heating of both the low melting glass and the filler particles. This can greatly contribute to the improvement of the productivity of the electronic components and decrease of thermal damages to the inside of the electronic component.

EXAMPLE 6

If the distance between the transparent substrates 1 and 2 was 100 µm or more, even when the laser was applied from both surfaces by the producing method shown in Example 2, no satisfactory airtightness and bondability could be obtained since cracks occurred in the sealing material 5 or the softening and fluidizing property of the low melting glass contained in the sealing material 5 was insufficient. In view of the above in this embodiment, the transparent substrates 1 and 2 were bonded by way of a spacer 6 interposed therebetween as illustrated in FIG. 2. A white board glass of high transmittance was used as the transparent substrates 1 and 2 and the spacer 6, and the transparent substrates 1 and 2 were bonded by the manufacturing method illustrated in FIG. 6 and FIG. 7 in the same manner as in Example 5, sealing material paste comprising 100 parts by volume of the low melting glass powder of G16 shown in Table 2, 20 parts by volume of $Zr_2(WO_4)(PO_4)_2$ filler particles containing $FeWO_4$ and $ZrO(PO_4)_2$, and ethyl cellulose and butyl carbitol acetate was used as the sealing materials 5 and 5' and coated to the spacer 6 as illustrated in FIG. 6 and, after drying, sintered in atmospheric air at 420° C. for 15 minutes. The thickness of the sintered film was about 15 µm respectively. The width of the spacer 6 was fixed to 3 mm, and the thickness was changed as 70, 320, 500 and 1000 µm respectively. With addition of the thickness of the sealing materials 5 and 5', the thicknesses were 100, 350, 530 and 1030 µm respectively. They were disposed at the outer peripheral portions of four sides and semiconductor lasers 7, 7' at a wavelength of 630 nm were applied from both surfaces of the transparent substrates 1 and 2 and to bond them. The laser transfer velocity was set to 15 mm/sec. The bondability was evaluated in the same manner as in Example 2. Good bondability was obtained in the case of using the spacer 6 of each thickness and it was found that the use of the spacer 6 was effective when the distance between the transparent substrates 1 and 2 was large.

EXAMPLE 7

In this example, a display having a lot of organic light emitting diode (OLED) disposed therein was manufactured and evaluated. The OLED display has a structure illustrated in FIG. 1. Since the OLED as the disposed organic element 3 tends to be deteriorated by moisture or oxygen, it is extremely effective to bond the outer peripheral portions of the transparent substrate 1 and 2 airtightly and firmly with the sealing material 5 containing the low melting glass. In this example, a non-alkali borosilicate glass used for liquid crystal displays was used as the transparent substrates 1 and 2. To the outer peripheral portion of the transparent substrate 1, a sealing material paste comprising 100 parts by volume of the low melting glass powder of G12 shown in Table 2, 35 parts by volume of $Zr_2(WO_4)(PO_4)_2$ filler particles containing $FeWO_4$ and $ZrO(PO_4)_2$, ethyl cellulose, and butyl carbitol acetate was used and coated to the outer peripheral portion of the transparent substrate 1 as illustrated in FIG. 3 and, after drying, sintered in atmospheric air at 420° C. for 15 minutes to form the sealing material 5. The formed sealing material had about 1.5 mm width and about 10 µm thickness for sintered film. On the other hand, a number of OLEDs corresponding to the number of pixels were formed to the transparent substrate 2 as illustrated in FIG. 4. The transparent substrate 2 and the transparent substrate 1 were opposed and the laser 7 was applied in the direction from the transparent substrate 1 to the sealing material 5 as illustrated in FIG. 5. A semiconductor laser at a wavelength of 805 nm was used as the laser 7, which was transferred along the outer peripheral portion at a velocity of 20 mm/sec to bond the outer peripheral portions of the transparent substrates 1 and 2. As a result of performing a lighting test on the OLED display just after preparation, it was confirmed that the display was lit up with no problems. Further, the bondability at the bonded portion was also satisfactory. Then, a high temperature high humidity test (saturated pressure type cooker test) was performed on the display for one day, three days, and seven days under the conditions at 120° C., 100% RH-202 kPa, and a lighting test was performed. As a comparison, a display bonded with a resin was also used. The resin bonded layer had about 3 mm width and about 10 µm thickness. While both of the OLED displays were lit up with no problems at high temperature and high humidity test for one day, large deterioration occurred for the display bonded with the resin in the lighting after three days. This is because moisture or oxygen was introduced from the resin bonded portion to the inside of the display to deteriorate OLED. On the other hand, deterioration was recognized in the lighting of OLED in the invention even after high temperature and high humidity test for seven days and the test result was satisfactory. That is a result suggesting that good airtightness was kept. In addition, as a result of evaluation also for the bondability at the bonded portion after the high temperature and high humidity test, such large deterioration as in the case of bonding with the resin was not observed and the state was substantially identical with that before the test.

In view of the above, it was found that the present invention is applicable effectively to the OLED display. It will be apparent that the invention is applicable also to electronic components such as lighting equipment in which OLED is mounted.

EXAMPLE 8

In this example, a dye-sensitized solar cell containing an organic dye was manufactured and evaluated. Generally, molecules of an organic dye are formed to the surface of a number of titania ($TiO_2$) nanoparticles in the solar cell. When the dye is irradiated with light, excited electrons are injected into $TiO_2$ and reach an electrode while diffusing in the nanoparticles. On the other hand, electrons are injected at the counter electrode into an electrolyte to reduce iodine (I). Thus, electric power can be generated. Since the dye-sensitized solar cell does not use vacuum, low temperature process, and silicon, this is effective for cost reduction but involves a significant problem in view of the reliability. A sealing technique is the key to the improvement of the reliability. Since the organic dye and the electrolyte of law heat resistance are used, sealing has to be performed at a temperature lower than the heat resistant temperature of them and resin sealing is generally used. However, resin sealing involves a significant problem that long time reliability cannot be ensured.

The present invention was trially applied to the sealing of the dye-sensitized solar cell in the same manner as in Example 7. A white board glass of high transmittance was used as the transparent substrates 1 and 2. The sealing material 5 was formed to the transparent substrate 1 by using the sealing material paste and under the sintering condition identical with those of Example 6. A cell containing a number of organic dyes, etc. was formed or disposed to the transparent substrate 2, and the outer peripheral portions of the transparent substrates 1 and 2 were bonded by laser irradiation in the same manner as in Example 7. They could be bonded firmly and the bondability was good. Further, also in the high temperature and high humidity test (saturated pressure cooker test) in the same manner as in Example 7, good airtightness was kept with no problems. In addition, the bondability after the high temperature and high humidity test was also good. Further, corrosion with iodine was not observed at the bonded portion as well. However, the electrode was corroded with iodine. In view of the above, the low melting glass according to the present invention is possibly applicable also to the coating of the electrode, etc. in addition to the sealing of the dye-sensitized solar cell.

In view of the above, it was found that the present invention is applicable effectively to the dye-sensitized solar cell. Further, it is applicable also to electronic components of organic solar cells, not being restricted only to the dye-sensitized solar cell.

EXAMPLE 9

In this example, a solar cell containing a lot of photoelectronic conversion elements and being bonded with a resin was manufactured and evaluated. A double-sided light receiving cell using a single crystal silicon substrate was used as the photoelectronic conversion element. The cells were connected in series by way of tab wires. Conventionally, they were bonded by an EVA sheet between two transparent substrates and fixed at ends by an aluminum frame and a resin sealing material. A white board glass of a high transmittance was generally applied for the transparent substrate. Most of subsequent accidents in the solar cells are caused by water permeating to the inside. The EVA sheet has no high gas barrier property (airtightness) and moisture gradually permeates for a long time and the moisture may possibly erode and disconnect the tab wires that connect cells, connection portions thereof, and electrodes formed to the cell. Accordingly, it is extremely important to prevent water permeation for ensuring the long time reliability of the solar cell. In this example, the white board glass was used as the transparent substrate and the EVA sheet was used as the bonding resin. Since the thickness of the both-sided light receiving cell used was about 250 µm including the thickness of the electrodes on both surfaces and the thickness of the attaching layer of the EVA sheet for both cell surfaces was about 250 µm, the substrates were bonded by way of the spacer as illustrated in FIG. 2. Since the distance between the transparent substrates 1 and 2 was about 500 µm, the white board glass of 3.5 mm width and 470 µm thickness was used as the spacer 6. The sealing material paste was prepared by using the low melting glass powder of G12 shown in Table 2, $Zr_2(WO_4)(PO_4)_2$ filler particles containing $FeWO_4$ and $ZrO(PO_4)_2$, $Nb_2O_5$ flier particles, ethyl cellulose and butyl carbitol acetate. The content of the filler particles was 15 parts by volume of $Zr_2(WO_4)(PO_4)_2$ filler particles containing $FeWO_4$ and $ZrO(PO_4)_2$, and 10 parts by volume of $Nb_2O_5$ filler particles, based on 100 parts by volume of the low melting glass G12. First, the sealing material paste was coated at 3 mm width to the outer peripheral portion of the transparent substrate 1 and one surface of the spacer 6 by a dispenser method and dried respectively. After drying, the paste was sintered in atmospheric air at 420° C. for 15 minutes and the sealing material 5 was formed to the transparent substrate 1 and the sealing material 5 was formed to the spacer. The thickness of each sintered films was about 15 μm, respectively. The spacer 6 formed with the sealing material 5' was disposed to the transparent substrate 2, heated in atmospheric air at 420° C. for 15 minutes under pressure, thereby bonding she spacer 6 and the transparent substrate 2 by the sealing material 5'. In this stage, the low melting glass paste of G12 described above was applied to the joint connecting the spacers 6 each other in order to ensure the airtightness at the corners, and sintered concurrently. Several both-sided light receiving cells connected by the tab wires were disposed between the transparent substrates 1 and 2 prepared as described above such that the sealing material 5 and the spacer 6 were opposed and bonded by way of the EVA sheet. Then, a semiconductor laser at a wavelength of 805 nm was transferred from the side of the transparent substrate 1 along the outer peripheral, portion at a velocity of 15 mm/sec and the transparent substrates 1 and 2 are bonded by way of the spacer 6 by the sealing materials 5 and 5'. Both the airtightness and the bondability were satisfactory. It is apparent that a reliability for a longer time can be ensured compared with the resin sealing material.

In this example, while the description of this Example has been made about a solar cell using the both-sided light receiving Si cell and the EVA sheet, this is applicable generally to solar cells in which the cells and the transparent substrates are bonded and fixed by using the resin. For example, this is applicable also to the thin film solar cell.

While the above descriptions have been made about the OLED display, the dye-sensitized solar cell and the Si solar cell applied with the invention, the invention is not restricted to them but is applicable generally to electronic components containing organic elements or organic materials of low heat resistance and can remarkably improve the reliability and the productivity of the electronic components.

TABLE 1

| [Example] glass No. | | G1 | G2 | G3 | G4 | G5 | G6 | G7 | G8 | G9 | G10 | G11 |
|---|---|---|---|---|---|---|---|---|---|---|---|---|
| Composition (mass %) | $V_2O_5$ | 50 | 50 | 50 | 50 | 48 | 47 | 47 | 47 | 46 | 46 | 45 |
| | $TeO_2$ | 32 | 30 | 30 | 21 | 32 | 30 | 30 | 23 | 28 | 23 | 32 |
| | $Fe_2O_3$ | 10 | 12 | 10 | 12 | 13 | 14 | 10 | 12 | 12 | 15 | 10 |
| | $P_2O_5$ | 8 | 8 | 6 | 10 | 7 | 9 | 9 | 10 | 7 | 13 | 4 |
| | $WO_3$ | | | 4 | 5 | | | 3 | 3 | 3 | 3 | |
| | $MoO_3$ | | | | | | | | 2 | | | 3 |
| | $MnO_2$ | | | | | | | | | | | 3 |
| | ZnO | | | | | | | 1 | 3 | | | 3 |
| | BaO | | | | 3 | | | | | 2 | | |
| | SrO | | | | | | | | | | 2 | |
| | CaO | | | | | | | | | | | |
| Density (g/cm³) | | 3.59 | 3.57 | 3.72 | 3.45 | 3.65 | 3.60 | 3.62 | 3.48 | 3.59 | 3.46 | 3.68 |
| DTA characteristic temperature (° C.) | Transition point $T_g$ | 263 | 268 | 257 | 315 | 265 | 278 | 274 | 325 | 292 | 336 | 285 |
| | Yield point $M_g$ | 280 | 290 | 276 | 330 | 284 | 297 | 293 | 350 | 310 | 362 | 305 |
| | Softening point $T_s$ | 322 | 334 | 315 | 373 | 326 | 341 | 338 | 389 | 356 | 397 | 353 |
| | Crystallization temperature $T_{cry}$ | 448 | 441 | 423 | 475 | 445 | 448 | 462 | 472 | 444 | 485 | 449 |
| Heat expansion coefficient (×10⁻⁷/° C.) | | 99 | 97 | 98 | 82 | 96 | 94 | 93 | 83 | 98 | 81 | 100 |
| Heat expansion characteristic temperature (° C.) | Transition temperature $T_G$ | 265 | 272 | 261 | 323 | 268 | 282 | 277 | 337 | 295 | 355 | 291 |
| | Deformation temperature $A_T$ | 302 | 309 | 297 | 357 | 307 | 318 | 315 | 371 | 330 | 377 | 325 |
| Moisture resistance (120° C. - 100% Rh-202 kPa-3 days) | | ○ | ○ | ○ | ○ | ○ | ○ | ○ | ○ | ○ | ○ | ○ |
| Softening and fluidizing property due to laser irradiation | 405 nm wavelength | ○ | ○ | ○ | ○ | ○ | ○ | ○ | ○ | ○ | ○ | ○ |
| | 532 nm wavelenglh | ○ | ○ | ○ | ○ | ○ | ○ | ○ | ○ | ○ | ○ | ○ |
| | 630 nm wavelength | ○ | ○ | ○ | ○ | ○ | ○ | ○ | ○ | ○ | ○ | ○ |
| | 805 nm wavelength | ○ | ○ | ○ | ○ | ○ | ○ | ○ | ○ | ○ | ○ | ○ |
| | 1064 nm wavelength | ○ | ○ | ○ | ○ | ○ | ○ | ○ | ○ | ○ | ○ | ○ |

TABLE 2

| [Example] glass No. | | G12 | G13 | G14 | G15 | G16 | G17 | G18 | G19 | G20 | G21 | G22 |
|---|---|---|---|---|---|---|---|---|---|---|---|---|
| Composition (mass %) | $V_2O_5$ | 45 | 45 | 45 | 45 | 45 | 45 | 45 | 44 | 43 | 43 | 43 |
| | $TeO_2$ | 30 | 30 | 30 | 30 | 27 | 25 | 20 | 29 | 30 | 30 | 28 |
| | $Fe_2O_3$ | 15 | 15 | 10 | 10 | 15 | 15 | 15 | 18 | 17 | 15 | 19 |
| | $P_2O_5$ | 10 | 7 | 9 | 7 | 10 | 10 | 10 | 9 | 10 | 12 | 10 |
| | $WO_3$ | | 3 | | 3 | 3 | 5 | 2 | | | | |
| | $MoO_3$ | | | | | | | 4 | | | | |
| | $MnO_2$ | | | | | | | | | | | |

TABLE 2-continued

| | Examples | | | | | | | | | | | |
|---|---|---|---|---|---|---|---|---|---|---|---|---|
| [Example] glass No. | | G12 | G13 | G14 | G15 | G16 | G17 | G18 | G19 | G20 | G21 | G22 |
| | ZnO | | | | 1 | | | | | | | |
| | BaO | | | 4 | 3 | | | 2 | | | | |
| | SrO | | | | 1 | | | 2 | | | | |
| | CaO | | | 2 | | | | | | | | |
| Density (g/cm³) | | 3.65 | 3.69 | 3.73 | 3.84 | 3.62 | 3.59 | 3.73 | 3.67 | 3.63 | 3.58 | 3.58 |
| DTA characteristic temperature (° C.) | Transition point $T_g$ | 308 | 297 | 298 | 302 | 311 | 316 | 328 | 315 | 321 | 318 | 332 |
| | Yield point $M_g$ | 329 | 317 | 325 | 324 | 335 | 338 | 351 | 340 | 345 | 340 | 354 |
| | Softening point $T_s$ | 377 | 365 | 371 | 375 | 380 | 386 | 399 | 383 | 387 | 387 | 401 |
| | Crystallization temperature $T_{cry}$ | 458 | 455 | 428 | 468 | 454 | 462 | 465 | 451 | 447 | 478 | 455 |
| Heat expansion coefficient (×10⁻⁷/° C.) | | 93 | 94 | 99 | 100 | 88 | 86 | 97 | 88 | 90 | 87 | 87 |
| Heat expansion characteristic temperature (° C.) | Transition temperature $T_G$ | 315 | 304 | 305 | 310 | 318 | 321 | 331 | 331 | 326 | 302 | 355 |
| | Deformation temperature $A_T$ | 357 | 345 | 347 | 351 | 359 | 362 | 378 | 363 | 367 | 340 | 377 |
| Moisture resistance (120° C. - 100% Rh-202 kPa-3 days) | | ○ | ○ | ○ | ○ | ○ | ○ | ○ | ○ | ○ | ○ | ○ |
| Softening and fluidizing property due to laser irradiation | 405 nm wavelength | ○ | ○ | ○ | ○ | ○ | ○ | ○ | ○ | ○ | ○ | ○ |
| | 532 nm wavelength | ○ | ○ | ○ | ○ | ○ | ○ | ○ | ○ | ○ | ○ | ○ |
| | 630 nm wavelength | ○ | ○ | ○ | ○ | ○ | ○ | ○ | ○ | ○ | ○ | ○ |
| | 805 nm wavelength | ○ | ○ | ○ | ○ | ○ | ○ | ○ | ○ | ○ | ○ | ○ |
| | 1064 nm wavelength | ○ | ○ | ○ | ○ | ○ | ○ | ○ | ○ | ○ | ○ | ○ |

TABLE 3

| | Examples | | | | | | | | | | | |
|---|---|---|---|---|---|---|---|---|---|---|---|---|
| [Example] glass No. | | G23 | G24 | G25 | G26 | G27 | G28 | G29 | G30 | G31 | G32 | G33 |
| Composition (mass %) | $V_2O_5$ | 43 | 42 | 41 | 40 | 40 | 40 | 39 | 38 | 38 | 37 | 35 |
| | $TeO_2$ | 25 | 27 | 30 | 35 | 30 | 25 | 25 | 30 | 30 | 33 | 30 |
| | $Fe_2O_3$ | 12 | 16 | 15 | 15 | 20 | 15 | 15 | 17 | 12 | 19 | 15 |
| | $P_2O_5$ | 10 | 10 | 9 | 4 | 10 | 10 | 12 | 15 | 10 | 11 | 10 |
| | $WO_3$ | 4 | 3 | | 3 | | 10 | | | 5 | | 5 |
| | $MoO_3$ | | | | | | | 3 | | | | 5 |
| | $MnO_2$ | | | | | | | | | 5 | | |
| | ZnO | | 2 | 5 | | | | 3 | | | | |
| | BaO | 3 | | | 3 | | | 3 | | | | |
| | SrO | 2 | | | | | | | | | | |
| | CaO | 1 | | | | | | | | | | |
| Density (g/cm³) | | 3.70 | 3.62 | 3.72 | 3.82 | 3.79 | 3.75 | 3.71 | 3.70 | 3.85 | 3.84 | 3.88 |
| DTA characteristic temperature (° C.) | Transition point $T_g$ | 315 | 310 | 285 | 279 | 341 | 297 | 309 | 350 | 318 | 336 | 322 |
| | Yield point $M_g$ | 345 | 334 | 311 | 299 | 364 | 320 | 326 | 369 | 336 | 360 | 345 |
| | Softening point $T_s$ | 388 | 380 | 358 | 339 | 406 | 364 | 379 | 410 | 385 | 400 | 399 |
| | Crystallization temperature $T_{cry}$ | 464 | 449 | 455 | 432 | 462 | 456 | 455 | 496 | 468 | 465 | 475 |
| Heat expansion coefficient (×10⁻⁷/° C.) | | 99 | 89 | 88 | 100 | 86 | 96 | 92 | 87 | 93 | 90 | 91 |
| Heat expansion characteristic temperature (° C.) | Transition temperature $T_G$ | 321 | 317 | 289 | 286 | 349 | 305 | 316 | 353 | 320 | 342 | 326 |
| | Deformation temperature $A_T$ | 362 | 359 | 337 | 322 | 386 | 350 | 358 | 385 | 362 | 379 | 368 |
| Moisture resistance (120° C. - 100% Rh-202 kPa-3 days) | | ○ | ○ | ○ | ○ | ○ | ○ | ○ | ○ | ○ | ○ | ○ |
| Softening and fluidizing property due to laser irradiation | 405 nm wavelength | ○ | ○ | ○ | ○ | ○ | ○ | ○ | ○ | ○ | ○ | ○ |
| | 532 nm wavelength | ○ | ○ | ○ | ○ | ○ | ○ | ○ | ○ | ○ | ○ | ○ |
| | 630 nm wavelength | ○ | ○ | ○ | ○ | ○ | ○ | ○ | ○ | ○ | ○ | ○ |
| | 805 nm wavelength | ○ | ○ | ○ | ○ | ○ | ○ | ○ | ○ | ○ | ○ | ○ |
| | 1064 nm wavelength | ○ | ○ | ○ | ○ | ○ | ○ | ○ | ○ | ○ | ○ | ○ |

TABLE 4

| | Comparative examples | | | | | | | | | | | |
|---|---|---|---|---|---|---|---|---|---|---|---|---|
| [Example] glass No. | | G34 | G35 | G36 | G37 | G38 | G39 | G40 | G41 | G42 | G43 | G44 |
| Composition (mass %) | $V_2O_5$ | 60 | 55 | 55 | 50 | 50 | 45 | 45 | 40 | 40 | 35 | 30 |
| | $TeO_2$ | 10 | 25 | 20 | 25 | 20 | 30 | 15 | 35 | 20 | 35 | 10 |
| | $Fe_2O_3$ | | | 10 | | 10 | | 10 | 5 | 10 | 15 | 5 |
| | $P_2O_5$ | 30 | 10 | 15 | 10 | 15 | 10 | 15 | 10 | 20 | 15 | 25 |
| | $WO_3$ | | | | | | 10 | 10 | 10 | 5 | | 5 |
| | $MoO_3$ | | | | 3 | | | | | | | 5 |

TABLE 4-continued

Comparative examples

| [Example] glass No. | | G34 | G35 | G36 | G37 | G38 | G39 | G40 | G41 | G42 | G43 | G44 |
|---|---|---|---|---|---|---|---|---|---|---|---|---|
| | $MnO_2$ | | | | | 9 | | | | | | 5 |
| | ZnO | | | 5 | | | | | | | | 5 |
| | BaO | | | 5 | 2 | 3 | 5 | 5 | | 5 | | 10 |
| | SrO | | | | | 2 | | | | | | |
| | CaO | | | | | 1 | | | | | | |
| Density (g/cm³) | | 3.10 | 3.38 | 3.42 | 3.55 | 3.64 | 3.88 | 3.71 | 3.96 | 3.77 | 3.94 | 3.65 |
| DTA characteristic temperature (° C.) | Transition point $T_g$ | 315 | 283 | 278 | 283 | 305 | 285 | 315 | 293 | 343 | 302 | 354 |
| | Yield point $M_g$ | 336 | 301 | 298 | 302 | 324 | 311 | 340 | 309 | 370 | 318 | 380 |
| | Softening point $T_s$ | 399 | 345 | 340 | 348 | 373 | 353 | 388 | 358 | 416 | 364 | 425 |
| | Crystallization temperature $T_{cry}$ | 425 | 442 | 396 | 487 | 419 | >500 | 484 | >500 | >500 | 465 | >500 |
| Heat expansion coefficient (×10⁻⁷/° C.) | | 85 | 94 | 105 | 103 | 107 | 110 | 96 | 125 | 92 | 112 | 104 |
| Heat expansion characteristic temperature (° C.) | Transition temperature $T_G$ | 320 | 288 | 283 | 285 | 309 | 289 | 321 | 296 | 347 | 307 | 357 |
| | Deformation temperature $A_T$ | 365 | 317 | 334 | 325 | 345 | 328 | 364 | 333 | 393 | 330 | 404 |
| Moisture resistance (120° C. - 100% Rh-202 kPa-3 days) | | x | x | x | Δ | x | x | x | Δ | x | Δ | x |
| Softening and fluidizing property due to laser irradiation | 405 nm wavelength | Δ | ○ | ▽ | □ | ▽ | ▽ | ○ | □ | Δ | □ | x |
| | 532 nm wavelength | ○ | ○ | □ | □ | □ | □ | ○ | □ | ○ | □ | ▽ |
| | 630 nm wavelength | x | ○ | ▽ | □ | ▽ | ▽ | ○ | □ | ○ | □ | x |
| | 805 nm wavelength | x | ○ | x | Δ | x | x | ○ | ▽ | Δ | □ | x |
| | 1064 nm wavelength | x | ○ | x | Δ | x | x | ○ | ▽ | x | ▽ | x |

TABLE 5

| | | Thickness of sintered film: 5 μm | | Thickness of sintered film: 10 μm | | Thickness of sintered film: 20 μm | | Thickness of sintered film: 30 μm | |
|---|---|---|---|---|---|---|---|---|---|
| | | Airtightness | Bondability | Airtightness | Bondability | Airtightness | Bondability | Airtightness | Bondability |
| Wavelength of laser irradiation | 405 nm | ○ | ○ | ○ | ○ | ○ | ○ | x | x |
| | 532 nm | ○ | ○ | ○ | ○ | ○ | ○ | ○ | ○ |
| | 630 nm | ○ | ○ | ○ | ○ | ○ | ○ | x | x |
| | 805 nm | ○ | ○ | ○ | ○ | ○ | ○ | ○ | x |
| | 1064 nm | ○ | ○ | ○ | ○ | ○ | ○ | ○ | ○ |

TABLE 6

| | 15 parts by volume | | 25 parts by volume | | 35 parts by volume | | 45 parts by volume | |
|---|---|---|---|---|---|---|---|---|
| Filler particle | Airtightness | Bondability | Airtightness | Bondability | Airtightness | Bondability | Airtightness | Bondability |
| $Zr_2(WO_4)(PO_4)_2$ | ○ | ○ | ○ | ○ | ○ | ○ | ○ | x |
| $Nb_2O_5$ | ○ | ○ | ○ | ○ | ○ | ○ | ○ | x |
| $LiAlSiO_4$ | ○ | ○ | ○ | ○ | ○ | ○ | ○ | x |

REFERENCE SIGNS LIST

1, 2: transparent substrate, 3: organic member, 5: sealing material, 6: spacer, 7, 7': laser, 8: sintered glass body.

The invention claimed is:

1. A sealing material paste comprising:
   a low melting glass;
   a resin binder; and
   a solvent,
   wherein the low melting glass contains vanadium oxide, tellurium oxide, iron oxide and phosphorous oxide, and satisfies the following relations (1) and (2) in terms of oxides:

$$V_2O_5+TeO_2+Fe_2O_3+P_2O_5 \geq 90 \text{ (mass \%)} \quad (1)$$

$$V_2O_5 > TeO_2 > Fe_2O_3 > P_2O_5 \text{ (mass \%)} \quad (2).$$

2. The sealing material paste according to claim 1, wherein the low melting glass further contains one or more of tungsten oxide, molybdenum oxide, manganese oxide, zinc oxide, barium oxide, strontium oxide and calcium oxide, and satisfies the following relation (3) in terms of oxides $$WO_3+MoO_3+MnO_2+ZnO+BaO+SrO+CaO \leq 10 \text{ mass \%} \quad (3).$$

3. The sealing material paste according to claim 1, wherein the low melting glass comprises 35 to 50 mass % of $V_2O_5$, 20 to 35 mass % of $TeO_2$, 10 to 20 mass % of $Fe_2O_3$, and 4 to 15 mass % of $P_2O_5$ in terms of oxides.

4. The sealing material paste according to claim 1, containing filler particles,
   wherein the filler particles are one or more of zirconium phosphotungstate ($Zr_2(WO_4)(PO_4)_2$), niobium oxide ($Nb_2O_5$) and β-eucryptite ($LiAlSiO_4$).

5. The sealing material paste according to claim 4, wherein the filler particles are zirconium phosphotungstate ($Zr_2(WO_4)(PO_4)_2$), and further contain iron tungstate ($FeWO_4$) and zirconium phosphate ($ZrO(PO_4)_2$).

6. The sealing material paste according to claim 4, wherein a content of the filler particles is greater than zero and less than or equal to 35 parts by volume based on 100 parts by volume of a powder of the low melting glass.

* * * * *